United States Patent [19]
Sharma et al.

[11] Patent Number: 5,812,598
[45] Date of Patent: Sep. 22, 1998

[54] HEARING ASSIST SYSTEM EMPLOYING TIME VARIANT MODULATION TRANSMISSION TO HEARING AID

[75] Inventors: Madan M. Sharma, Palos Verdes; Robert Francis Young, Santa Cruz; Gene Michael Strohallen, Sebastopol, all of Calif.

[73] Assignee: Phonic Ear Incorporated, Petaluma, Calif.

[21] Appl. No.: 766,802

[22] Filed: Dec. 13, 1996

Related U.S. Application Data

[63] Continuation of Ser. No. 86,823, Jul. 2, 1993, Pat. No. 5,615,229.

[51] Int. Cl.$^6$ .................................................. H04L 27/00
[52] U.S. Cl. ........................... 375/259; 381/68; 381/68.4; 381/94.1; 381/94.8
[58] Field of Search ...................................... 375/254, 237, 375/238, 239; 370/205, 212, 213; 381/23.1, 60, 68, 68.1, 68.2, 68.4, 94.1, 94.8

[56] References Cited

U.S. PATENT DOCUMENTS

| | | | |
|---|---|---|---|
| 3,711,651 | 1/1973 | Connell | 370/205 |
| 3,742,359 | 6/1973 | Behymer | 325/26 |
| 4,171,467 | 10/1979 | Evenchik | 375/216 |
| 4,259,746 | 3/1981 | Sandstedt | 375/259 |
| 4,524,335 | 6/1985 | Yokoyama | 375/238 |

*Primary Examiner*—Don N. Vo
*Attorney, Agent, or Firm*—Graham & James LLP

[57] ABSTRACT

A short range magnetically coupled wireless communication system employs time variant modulation of a high repetition rate pulse stream and magnetic coupling between a transmission magnetic element and a receiving magnetic element. The pulse stream is modulated by an input audio frequency signal in the time domain, for example, through pulse position modulation, pulse width modulation or pulse symmetry modulation. The receiving magnetic element is coupled to a demodulator circuit which detects the transmitted pulses induced in the receiving magnetic element and reproduces the audio frequency signal. Transmission over short range is thus efficiently accomplished through magnetic coupling in a simple, low cost, low power consumption communication system.

19 Claims, 17 Drawing Sheets

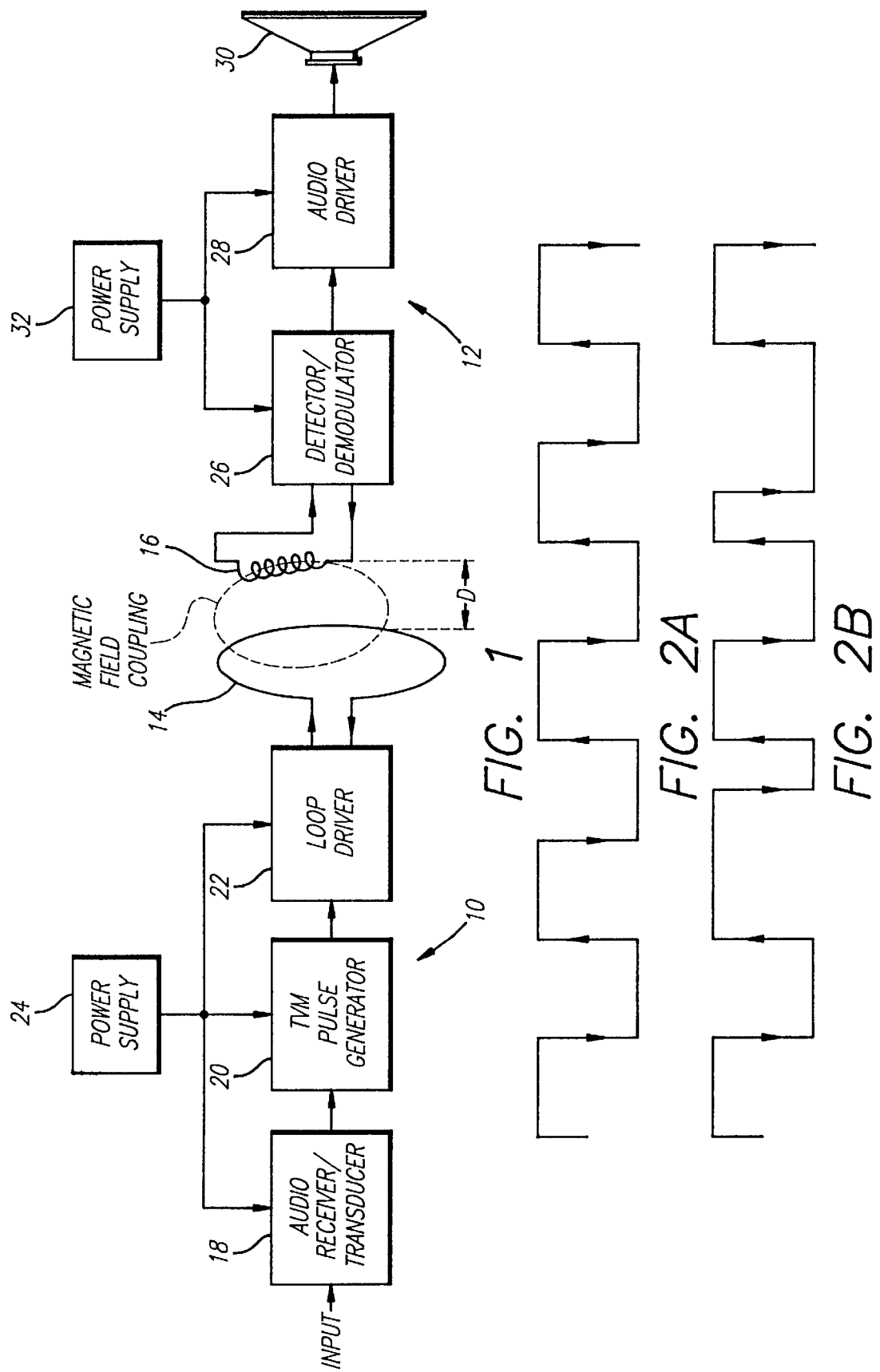

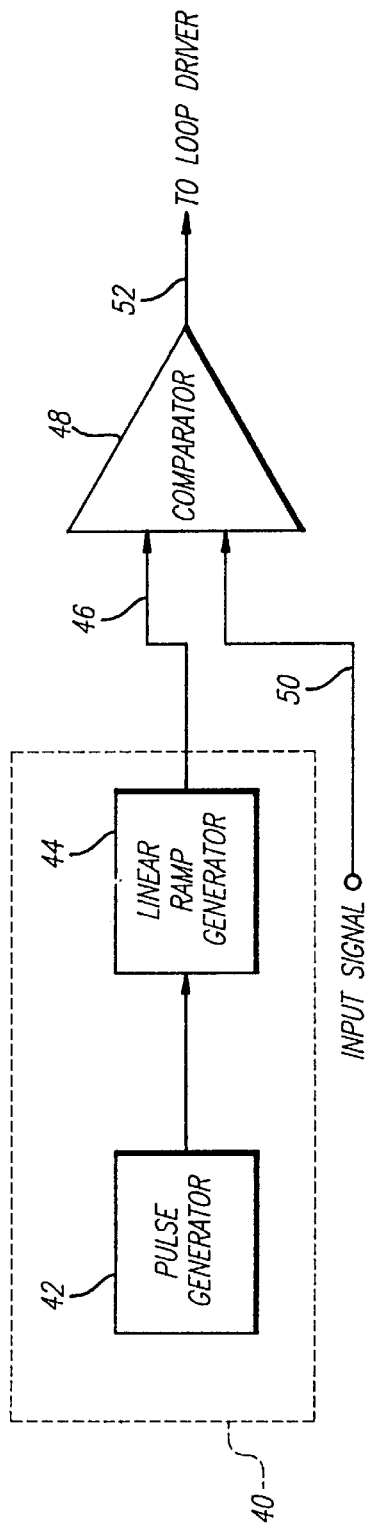
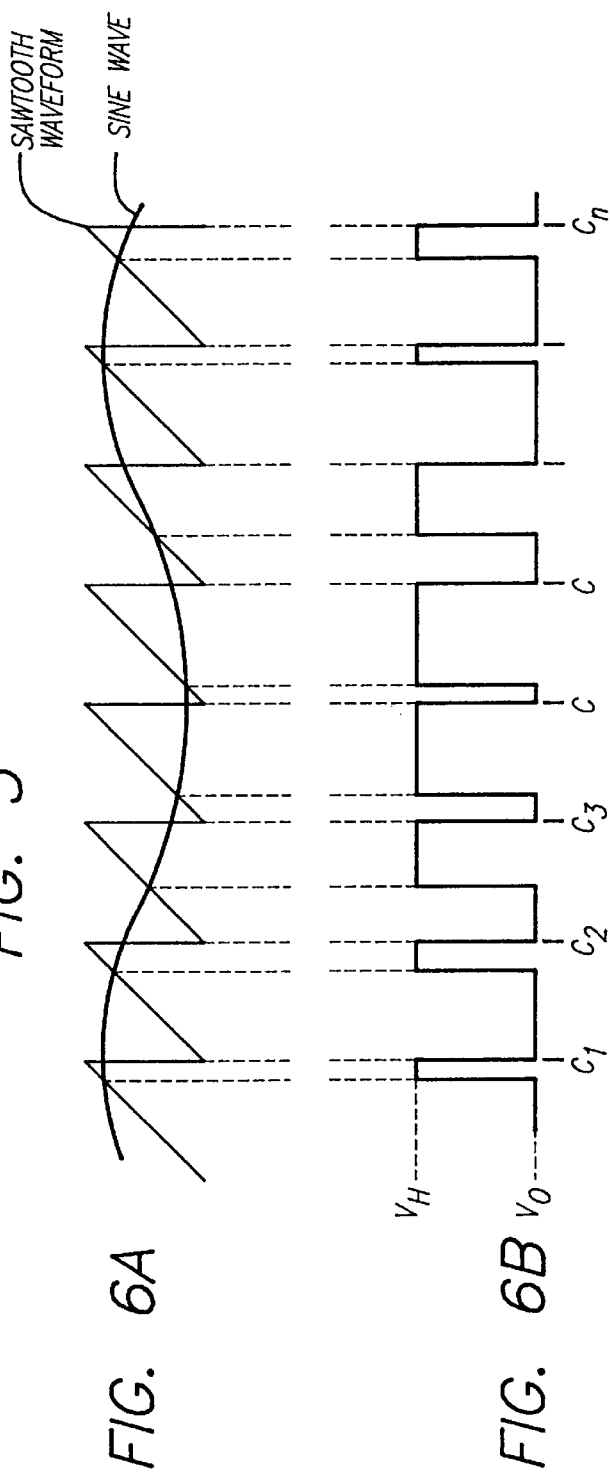
FIG. 5
FIG. 6A
FIG. 6B

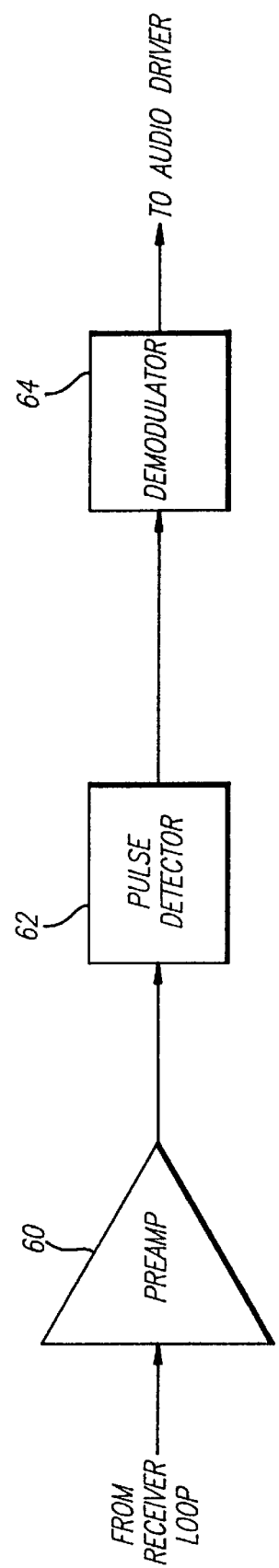
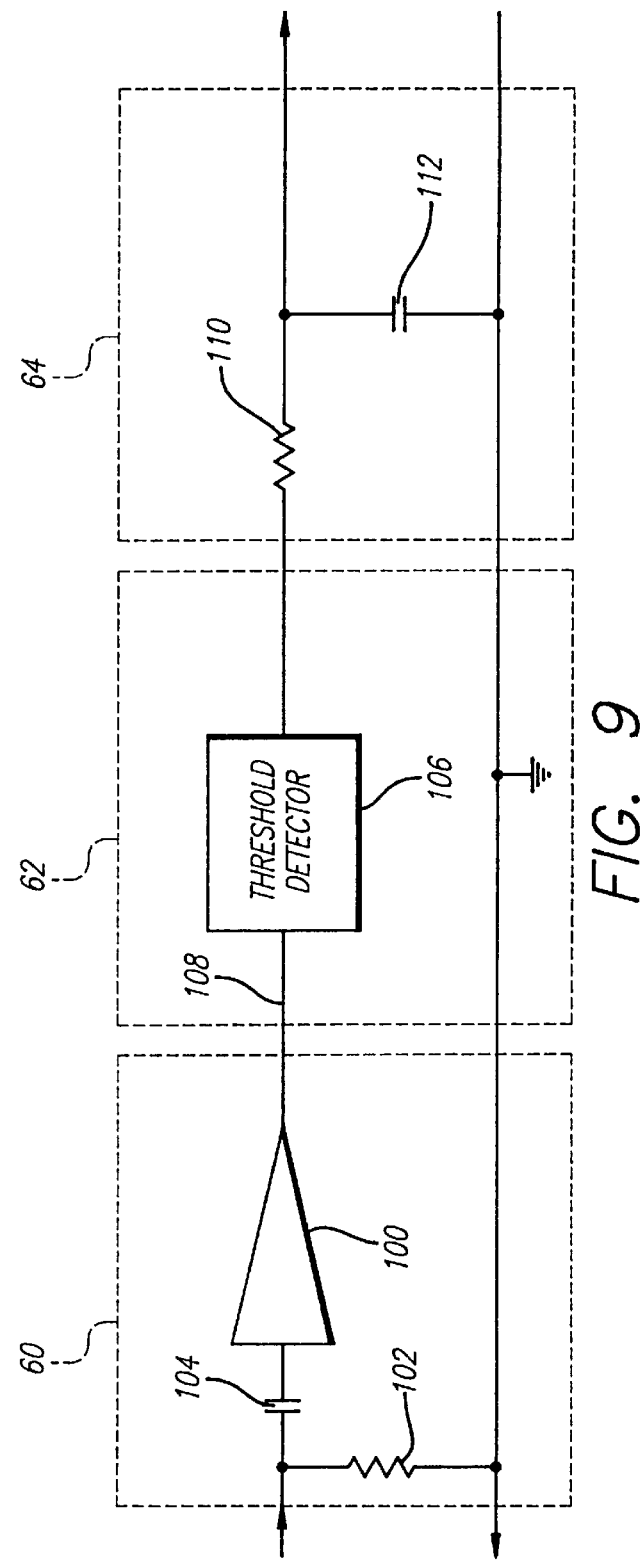

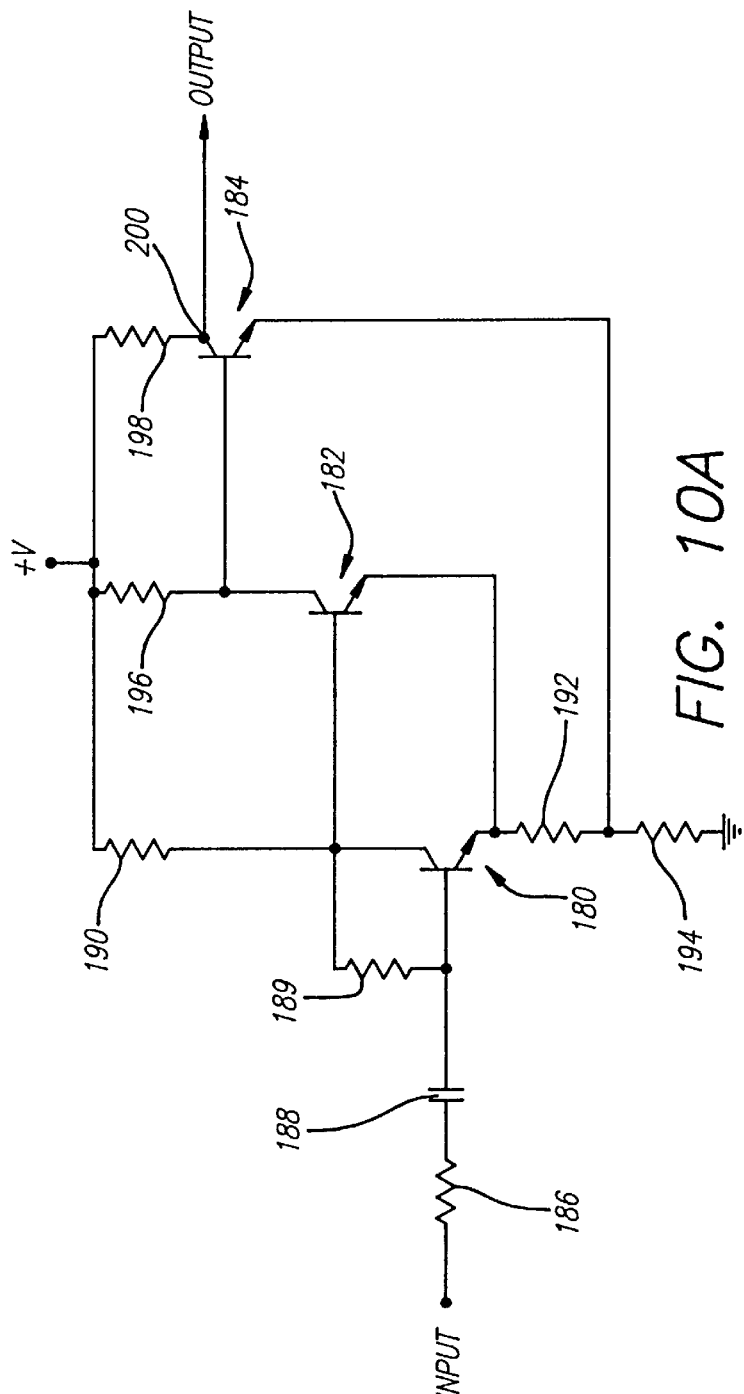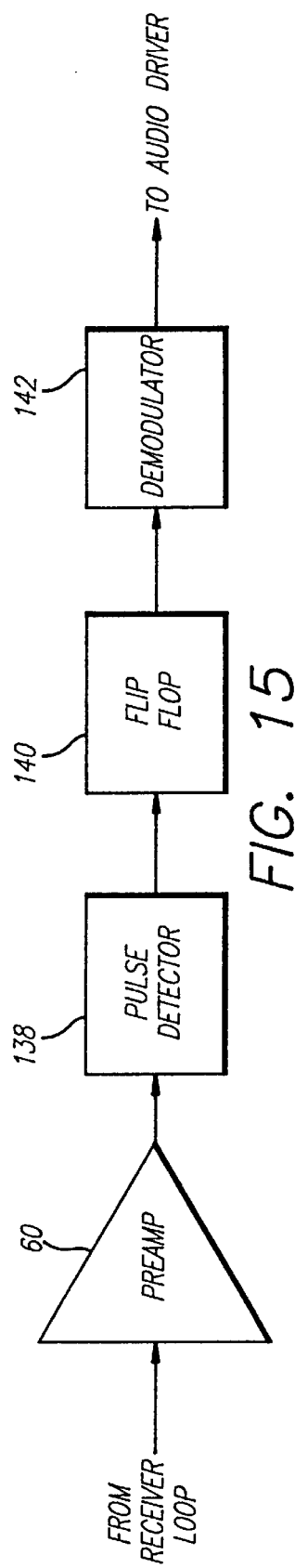

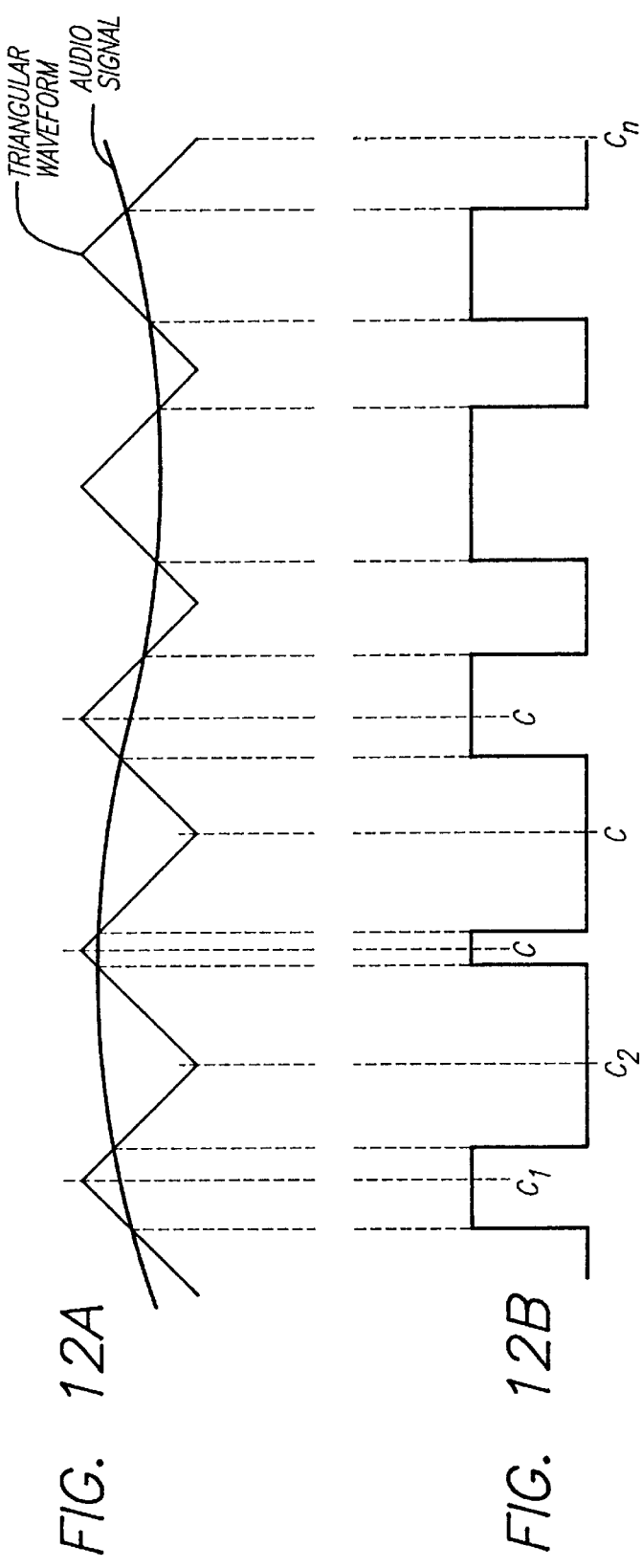
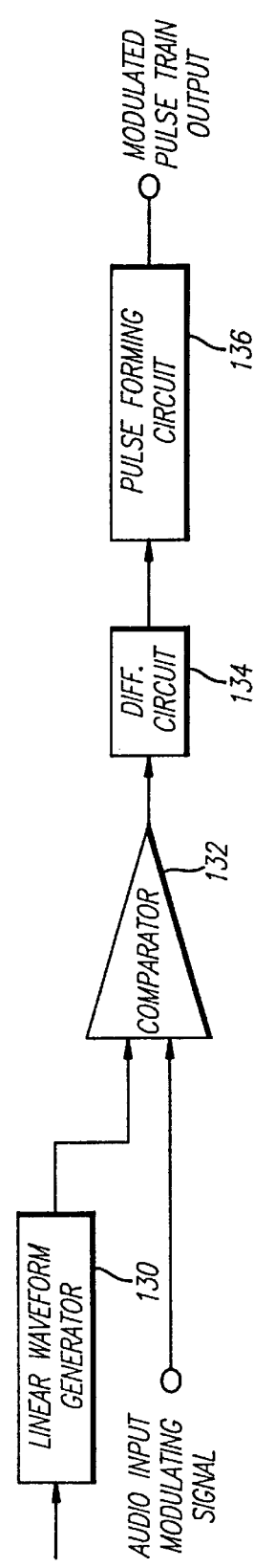

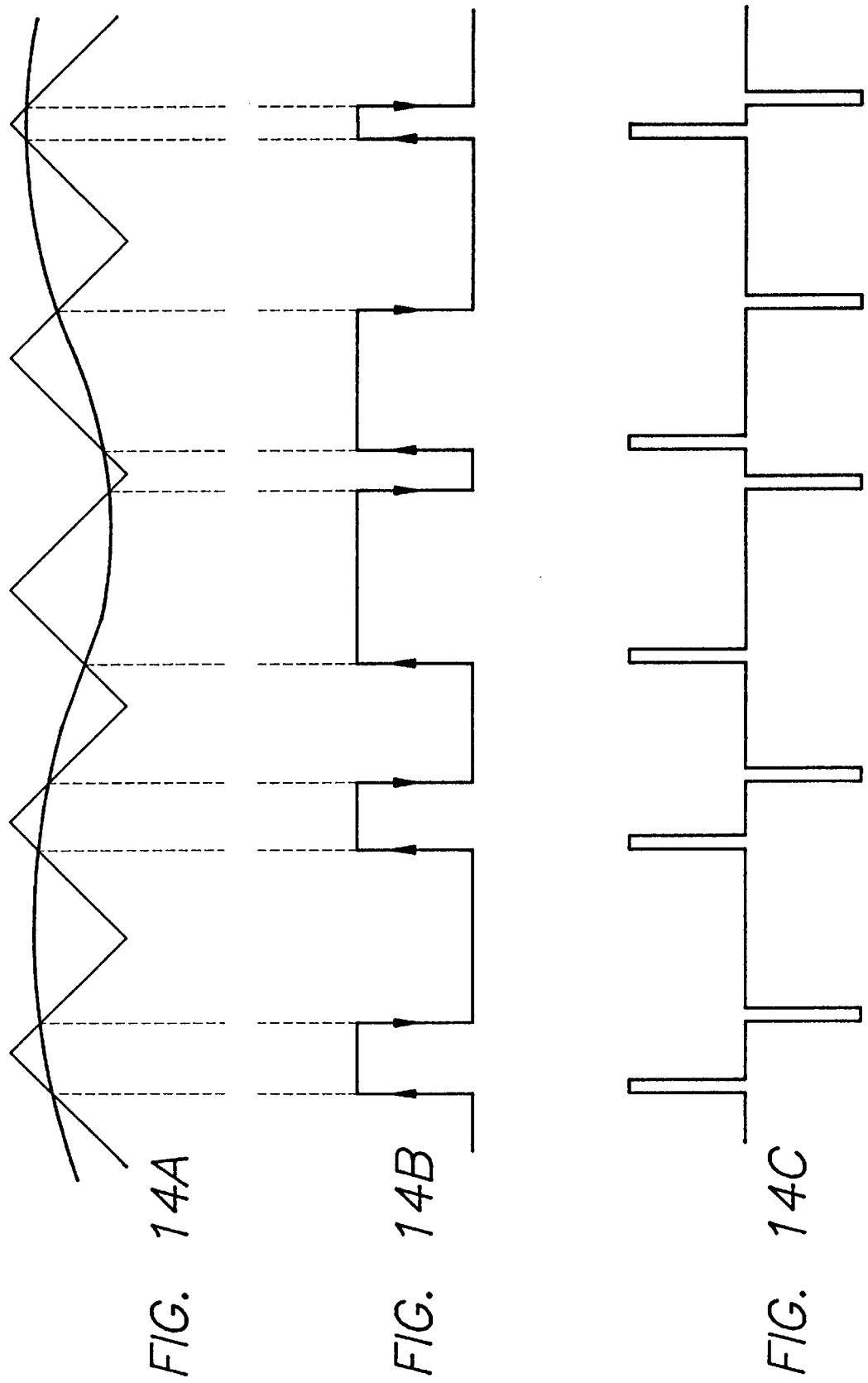

HEARING ASSIST SYSTEM EMPLOYING TIME VARIANT MODULATION TRANSMISSION TO HEARING AID

This is a continuation of application Ser. No. 08/086,823, filed on Jul. 2, 1993, U.S. Pat. No. 5,615,229.

BACKGROUND OF THE INVENTION

1. Field of the Invention

The present invention relates to short range wireless communication systems. More particularly, the present invention relates to short range inductively coupled communication systems.

2. Description of the Prior Art and Related Information

Short range wireless communication systems are of significant importance for a variety of applications. Although many applications are quite common, such as cordless telephones, "walkie talkies" and cordless microphones, a large number of other potential applications also exist. Such potential applications, which could include virtually any system employing audio cord coupling, have generally not been exploited due to limitations in existing short range communication systems.

There are four basic wireless communication systems in use today: acoustic, radio frequency, infrared and inductive. Each of these has performance characteristics, and attendant advantages and limitations, well known to those skilled in the art. For example, acoustic communication is short range, can cover large groups of people and is subject to interference. Radio frequency (or RF) communication in turn is long range and can use many forms of modulation including amplitude modulation (AM) and frequency modulation (FM) for transmitting signals on an RF carrier. Infrared communication is generally limited to short range, line of sight communication and is immune to forms of interference other than light. The cost vs. range vs. fidelity of each method is well known to those skilled in the art.

The last noted approach to short range wireless communication employs inductively coupled, or magnetically coupled, wireless transmission. In particular, this approach has been employed in hearing assistive devices for communication between a belt worn radio and a small hearing aid of the type worn behind the ear (BTE) or in the ear (ITE). Cordless coupling between the belt worn device and the ITE or BTE hearing aid is important both for aesthetic reasons, in view of the fact that hearing aid wearers usually desire to avoid calling attention to their hearing disability, as well as for practical reasons relating to awkwardness relative to a cord directly attached to a BTE or ITE hearing aid.

In such a hearing assistive application, the belt worn receiver or microphone is coupled via a cord or cable to a loop which is worn under the clothing of the hearing aid user and encircles the user's neck. The ITE or BTE hearing aid in turn has an inductive pick up loop therein, for example, the inductive loop employed for picking up telephone audio (so called teleloop, T-loop or T-coil), to pick up the audio signal from the neck worn transmission loop. The audio signals from the belt worn audio source directly amplitude modulate the current through the neck worn loop to produce an amplitude modulated signal in the audio frequency band. This is commonly referred to as a base band amplitude modulation system, since no carrier frequency is employed (as in the case of RF transmission). The use of an inductive loop allows connecting cords to be omitted from the ITE or BTE hearing aid thus providing the advantages of aesthetics, i.e., removing visible cords from the hearing impaired user, as well as convenience due to the lack of cords which may become tangled or interfere with the actions of the user.

One advantage of an inductively coupled system relative to an RF transmission system is that since that such an inductively coupled system operates in the audio frequency range, FCC regulation is not applicable and problems related to FCC licensing are avoided. Another advantage of inductive coupling for short-range communication systems of this type is that low power consumption is associated with the system. Due to the desired small size of the hearing aid, low power consumption is a key requirement since any batteries employed must be of small size and hence limited in power supply capabilities. Also, the transmitter portion of the system, in the noted example a belt worn device, may be battery operated and hence sensitive to power consumption.

A significant disadvantage of an inductively coupled base band amplitude modulated system is the tendency to experience signal variations due to changes in the relative orientation of the receiving coil and the transmission loop as well as sensitivity to distance between the receiving coil and transmission loop. This not only causes fading in and out of the signal as the user moves about, but also creates serious signal to noise problems where lower magnitude audio signals are being transmitted.

In addition, the electrical inductance of either the transmitting or receiving coil is inversely related to the bandwidth of the system. Increasing the electrical inductance reduces the bandwidth, providing a "Catch-22" where wide bandwidth low power transmission is desired.

Another problem of base band inductively coupled systems is the high background noise typically present due to the magnetic fields of common electrical devices. A base band magnetic element (pick up coil) typically has its resonance in the audio range, and a typical system has a sensitivity around 2 milliGauss (mG). Electrical appliances, motors, fluorescent lights produce a magnetic field in the 60–120 Hz range, which overlaps the audio range and can be detected in base band operation. The following are typical magnetic field strength of a variety of electrical devices, measured at a distance of 3 feet.

| | |
|---|---|
| Fluorescent Lights | 3 mG |
| Electric Toaster | 3 mG |
| Electric Motor | 2 mG |
| House Wiring | 2 mG |
| Electric Blanket | 100 mG |

When compared to an inductive coupled base band system sensitivity of about 2 mG, it is clear these items have enough of a magnetic electric field to cause significant interference in base band systems.

There are thus several serious limitations associated with base band systems: signal fading with varying distance and orientation of the receiver with respect to the loop; signal to noise ratio deterioration with distance; restrictions on the signal bandwidth by parameters of the circuit elements; and presence of high background noise due to common electrical devices. Therefore, the quality of audio communication provided by base band systems has been less than desired.

Accordingly, it will be appreciated that a need presently exists for a short range wireless communication system which consumes relatively little power and which can be implemented without complex circuitry. It will be further appreciated that a need presently exists for a short range wireless communication system which provides good audio quality reception and which is not subject to the above-noted problems. It will be further appreciated that a need presently exists for a short range wireless communication system which is not subject to federal regulations involving long range communication systems.

SUMMARY OF THE INVENTION

The present invention provides a short range wireless communication system which consumes very little power and which employs relatively simple and inexpensive circuitry for both the transmission and reception portions of the system. The present invention further provides a short range wireless communication system which is not subject to amplitude variation and noise problems related to orientation and distance of the transmission and reception portions of the system.

The short range wireless communication system of the present invention employs Time Variant Modulation (TVM) along with inductive (or magnetic) coupling of a transmission element and a receiving element to achieve the above-noted results. More specifically, the present invention employs transmission of a relatively high repetition rate train of relatively constant amplitude pulses which are modulated by the audio frequency signal desired to be transmitted. The characteristics of the pulse train which are modulated by the audio frequency input signal relate to the time domain. For example, the duration of each pulse in the pulse train may be modulated so that it corresponds to the instantaneous magnitude of the audio frequency input signal.

The modulated high repetition rate pulse train is provided to the transmission element which is magnetically coupled to a receiving element. The receiving element is configured in a receiver and at least one of the elements is freely movable relative to the other. For example, the receiver may be configured in a head worn device such as a headset or in-ear receiver, or in a hand held or other portable receiver. The magnetically induced current in the receiving element, which may be a simple loop, drives a pulse detector and demodulator circuit which decodes the time variant modulated pulses and reproduces the original audio frequency signal. This reproduced audio frequency signal is then provided to a speaker for reproduction of the audio signal.

In a preferred embodiment, the transmission or modulating circuitry may employ a relatively straightforward sawtooth wave generator, triangle wave generator or other substantially linear waveform generator. The linear waveform is compared to the audio frequency input signal to generate a time variant modulated pulse train. This pulse train preferably has a pulse frequency (i.e., repetition rate) at least 2.6 times that of the highest frequency in the audio frequency signal to be transmitted, typically 30 kHz for normal audio signals falling below 12 kHz. The high repetition rate modulated pulse train is provided, via an magnetic element driving circuit, to an magnetic transmission element which is of dimensions and configuration adapted for the specific application. For example, a neck worn or belt worn loop may be employed for transmission from a portable transmitter/audio source to a head worn device such as a headset or an ITE or BTE hearing aid. Much larger fixed loops or other elements may be employed where transmission is desired to multiple receivers in an enclosed space, such as a room, instead of an individual head worn device.

The receiving or demodulating circuitry may also be relatively simple. For example, in the case of modulation of the pulse train duty cycle, referred to herein as symmetry modulation, a simple RC (resistor and capacitor) circuit may be employed to integrate the pulses to demodulate the time domain modulated pulse train and reproduce the audio signal at the receiver. For application in a head worn device, a very low power amplifier is all that is required to drive a speaker worn in the ear or adjacent the ear of the user. The receiver may thus provide both low cost and lightweight construction with very little power consumption.

It will be appreciated by those skilled in the art that the present invention, employing modulation in the time domain as opposed to the amplitude domain, avoids the problems associated with amplitude modulated base band magnetic coupled systems related to amplitude sensitivity to orientation and distance between the transmitting and receiving loops. In particular, since all the pulses in the pulse train are of the same magnitude, with only their duration or other time characteristics being modulated in response to the input, variations in coupling efficiency between the transmitting and receiving magnetic elements will not affect the demodulated output signal. Furthermore, the pulse magnitude and/or receiver sensitivity may be chosen so as to provide a desired signal to noise ratio.

Accordingly, it will be appreciated by those skilled in the art that the present invention provides a short range magnetically coupled wireless communication system which overcomes the above-noted problems in the prior art. Further features and advantages of the system of the present invention will be appreciated by review of the following detailed description of the invention.

BRIEF DESCRIPTION OF THE DRAWINGS

FIG. 1 is an electrical schematic drawing in block diagram form of the short range magnetically coupled wireless communication system of the present invention.

FIG. 2A is a timing diagram illustrating the unmodulated pulse train provided by the transmission circuitry of the short range magnetically coupled wireless communication system of the present invention.

FIG. 2B is a timing diagram illustrating the pulse train of FIG. 2A after being modulated by an input audio frequency signal.

FIG. 5 is a block diagram of the time variant modulation (TVM) pulse generator of the system of FIG. 1 in accordance with a preferred embodiment employing symmetry modulation.

FIG. 6A is a timing diagram illustrating a sine wave input signal and a sawtooth waveform which are combined to provide a square wave variable duration output pulse train as illustrated in FIG. 6B.

FIG. 7 is a block diagram of a demodulator circuit employed in the receiver portion of the short range wireless communication system of FIG. 1.

FIG. 9 is an electrical schematic drawing illustrating a preferred embodiment of the demodulator circuit of FIG. 7.

FIG. 10A is an electrical schematic drawing of a threshold detector employed in the circuit of FIG. 9.

FIG. 12A is a timing diagram illustrating the modulation of a triangular waveform by a sine wave signal and the resultant pulse width modulated square wave pulse train is illustrated in FIG. 12B.

FIG. 13 is a block diagram of a TVM pulse generator circuit in accordance with an alternate embodiment employing pulse position modulation in the transmitter portion of the short range communication system of FIG. 1.

FIGS. 14A, 14B and 14C are timing diagrams illustrating the input audio signal and a triangular waveform, the square wave output pulse train, and a constant width pulse output, respectively, provided by the circuit of FIG. 13.

FIG. 15 is a block schematic diagram of a detector/demodulator circuit in the alternate embodiment of the present invention employing pulse position modulation transmission.

DETAILED DESCRIPTION OF THE INVENTION

Figure 3:
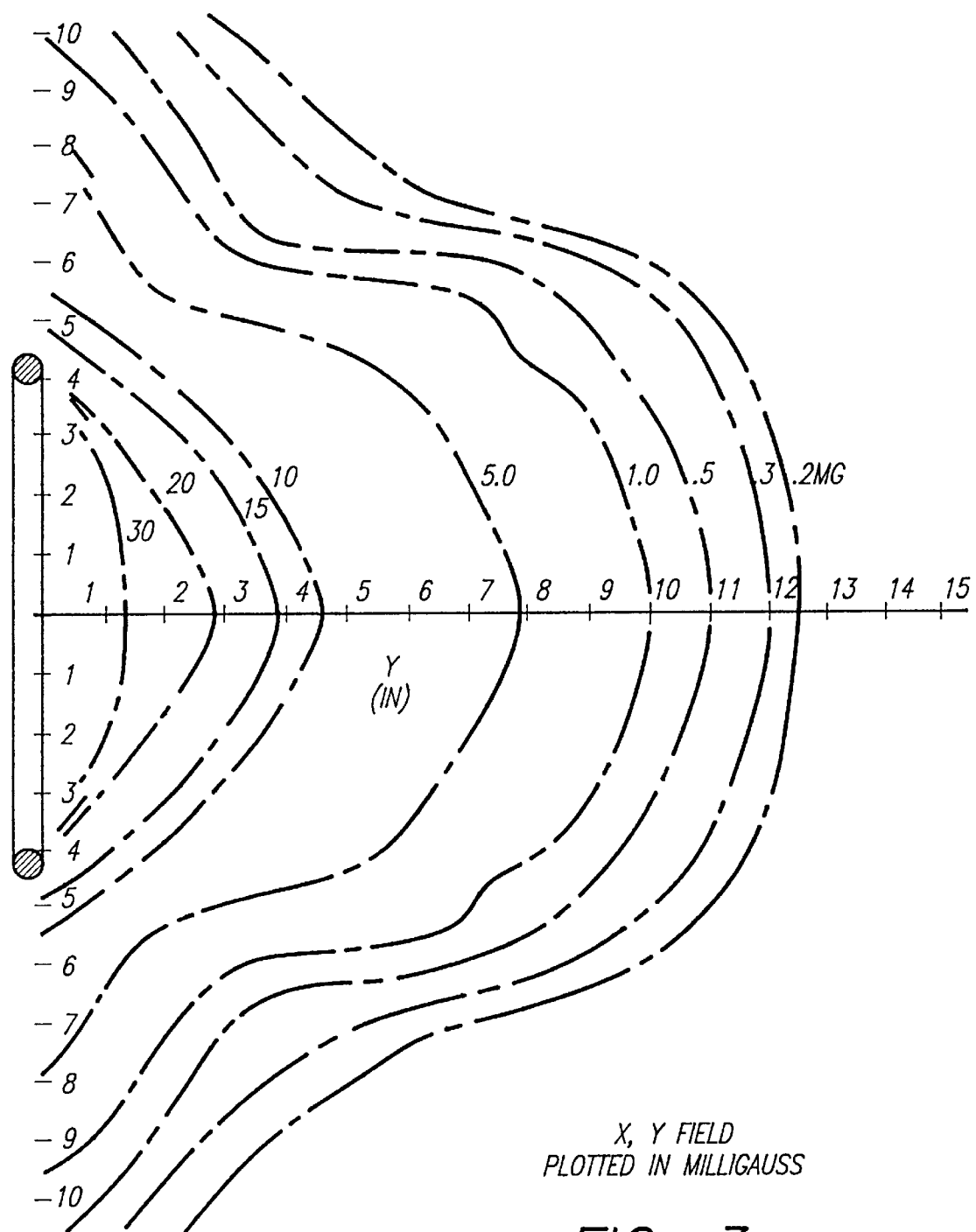
FIG. 3 is a schematic drawing of the loop geometry and field strength for the data of Table 1.

Referring to FIG. 1, the short range wireless communication system of the present invention is illustrated in block schematic form. As shown, the system includes a transmitter portion 10 and a receiver portion 12 which are separated by variable transmission distance D. At least one of transmitter portion 10 and receiver portion 12 is thus freely movable to provide such variable transmission distance D. The transmitter portion 10 includes a transmitting magnetic element 14 and the receiver portion 12 includes a receiving magnetic element 16.

As indicated schematically in FIG. 1 by the dashed line, the transmission system of the present invention employs magnetic coupling between the two magnetic elements 14, 16; that is, signals in the transmitting element 14 induce signals in the receiving element 16 by the mutual magnetic coupling of the two circuits formed by these two elements. The strength of the magnetic field provided by the transmitting magnetic element 14 as well as the voltage induced in the receiving element 16 may be determined empirically or, estimated from basic magnetic theory. The basic parameters affecting magnetic field and induced current may be illustrated by considering the following basic magnetic equations and terms applicable for simple transmitting elements and receiving elements:

"$B$" is Magnetic Field (Tesla) 1 TESLA=1 Newton/Amp. Meter=1 Weber/(Meter)$^2$=10$^4$ Gauss  (1)

$\phi$ is magnetic flux  (2)

$\phi=BA$=(Magnetic Field)·(Area)  (3)

$B=\mu/2\ (I)/(S)$=field generated with a straight conductor  (4)

$B=(\mu)/2\ (I)/R$=field generated in a current loop  (5)

$B=\mu N/L\ I$=field generated in a coil

Where $\mu$ is permeability, I=current, S=distance, R=loop Radius, N=number of turns, L=length of coil.

Thus, from equations (4) and (5), in general more current yields a higher magnetic field (more Gauss). Additionally, the magnetic field falls with distance, in a manner depending on the geometry of the transmitting element.

The induced voltage in a receiver coil depends upon the following equations:

$v=Nd\phi/dt$ $v=dB/dt$·(interacting area)

where v=induced voltage, N=number of turns, and $d\phi/dt$= rate of change in magnetic flux.

Thus, increasing the number of turns yields a higher received voltage. Also, from equation (6) it will be appreciated that a higher rate of change of flux, usually associated with frequency of operation, yields more output voltage. The rate of change of flux ($d\phi/dt$) is related to the bandwidth of operation. Equation (7) in turn reflects the direct relation of size of the receiving coil to induced voltage. This means a larger area of interaction with the flux yields more output from the receiving element. Further increases in the voltage induced in the receiver loop 16 can be accomplished by inserting a flux concentrating material such as a magnetic alloy or ferrite material.

From the foregoing, it will be appreciated that the magnetic coupling of the transmitting loop 14 and receiving loop 16 may be increased by increasing one or more of the following system parameters:

1. Current in the transmitting loop.
2. Number of turns in the receive coil.
3. Size of receive coil.
4. Flux concentrating inserts to interact with more magnetic flux.
5. Transmitting loop geometry and construction.
6. Increased sensitivity in the receiver circuit. Also, it will be appreciated that:
7. Bandwidth requirements dictate the magnitude of $d\phi/dt$, which also affects the magnitude of the magnetic coupling.

It will further be appreciated that the magnetic coupling between the transmitting loop 14 and receiving loop 16 is restricted or impeded by the following factors:

8. Distance
9. Inductance in the transmitting loop (i.e. since inductance restricts bandwidth, the magnitude $d\phi/dt$ is restricted).

Accordingly, it will be appreciated that the foregoing parameters of the system may be selected to provide the desired coupling, transmission distance, and bandwidth for the specific application.

The communication system of the present invention is specifically designed for short range communication, i.e., less than 100 meters. The transmission distance D may be on the order of less than 1 to more than 5 the times the dimensions of the transmitting magnetic element 14 so as to advantageously exploit the efficient magnetic coupling between the transmission magnetic element 14 and the receiving magnetic element 16. In some applications, however, it may be advantageous to modify one or more of the above noted parameters, e.g. by increasing the current output to the transmitting magnetic element 14, to allow the communication distance D to be a greater multiple of the magnetic element diameter. Even in such applications the transmission distance D will be much less than that of RF communication systems which provide communication over distances many thousands of times the size of the transmitting antenna.

It should further be appreciated that the relative dimensions of the transmitting magnetic element 14 and receiving magnetic element 16, are not to scale in FIG. 1. In some applications the transmitting magnetic element will be substantially larger than the receiving element. As will be discussed in more detail below, the receiver portion of the communication system 12 may typically be adapted to beconfigured in a portable unit, such as a head worn device, and may be even of a sufficiently small size to fit behind the ear or in the ear of a user. The transmitting magnetic element 14 in turn may range from a very small size, such as adapted to be used in a microphone portion of a headset, to a magnetic element which is large enough to encircle a room, or even an auditorium, to provide transmission to a large number of receivers 12. Also, the single loop illustrated for transmitting magnetic element 14 may be replaced by multiple magnetic elements in parallel or in a coil configuration. A variety of other magnetic elements may also be employed. Receiving magnetic element 16, in turn, which is illustrated as a coil, may be replaced with a single turn magnetic element or multiple, magnetic elements configured in different geometries.

Also, it should be appreciated that the orientation of the magnetic elements as illustrated in FIG. 1 is purely for ease of illustration. Typically, the best magnetic coupling between the transmitting magnetic element 14 and receiving magnetic element 16 will be achieved by placing the receiving magnetic element in a direction generally along the line of the axis perpendicular to the plane of the transmitting loop. Nonetheless, in most applications, the receiving magnetic element and the receiving unit 12 will be freely movable relative to the transmitting unit 10 and transmitting magnetic element 14, thus changing both the distance and orientation relative thereto.

Still referring to FIG. 1, the transmitter portion 10 receives an external input which is provided by an audio signal such as a receiver or microphone 18. The external input contains the signal desired to be transmitted to the receiver portion 12. The external input provided to receiver/transducer 18 may be an acoustic audio signal in which case the receiver/transducer 18 may simply be a microphone, amplifier, compressor or other well known device for transducing acoustic signals to audio frequency electrical signals. Alternatively, the external input may be provided by means of a remotely transmitted signal, such as an RF signal containing audio information, in which case the receiver/transducer 18 includes appropriate RF receiver circuitry to pick up and convert the RF signal to an audio frequency electrical signal. Alternatively, the external input may be provided from other sources either connected through wires or part of the same overall equipment as the receiver/transducer 18. For example, an audio reproduction system providing prerecorded audio frequency signals, such as from a tape recorder, cassette, CD or other well known audio recording medium may provide the input signal. Also, while audio frequency input signals are discussed in detail herein, it should be appreciated that other types of signals, including other frequency ranges and digital data pulses instead of continuous audio signals, may also be transmitted by the system of the present invention.

The input signal, after being converted to audio frequency electrical signals by receiver/transducer 18, is provided to Time Variant Modulation (TVM) pulse generator 20. TVM pulse generator 20 receives the audio frequency input signal provided by receiver/transducer 18, and employs it to modulate a repetitive pulse stream in the time domain. That is, the input signal does not alter the magnitude of the pulses or the frequency composition of a given pulse but rather alters the pulse characteristics in the time domain. As will be discussed in more detail below, such time variant modulation provides significant advantages over base band amplitude modulation such as employed in prior art systems.

The repetition rate of the pulse train provided by the TVM pulse generator 20 may vary over a wide range but is preferably at least 2.6 times the frequency of the highest frequency component in the audio signal to be transmitted. Higher pulse repetition rates may be employed up to, for example, one MHz or greater. The pulses provided by TVM pulse generator 20 are preferably of substantially equal amplitude with such amplitude chosen to enhance the signal to noise ratio in the receiver portion 12, as will be discussed in more detail below.

Referring to FIGS. 2A and 2B, the time variant modulation provided by TVM pulse generator 20 may be best appreciated by reference to a specific example of such modulation technique. In FIG. 2A, an unmodulated pulse train is illustrated in the form of a square wave signal with a 50% duty cycle and fixed clock or repetition rate. Either the consecutive up transitions or consecutive down transitions of the square wave pulses may be taken as defining the clock period of the pulse train. This signal illustrated in FIG. 2A would correspond to the output of TVM pulse generator 20 in response to a 0 DC voltage signal input thereto. FIG. 2B in turn represents the pulse train of FIG. 2A after being modulated with a varying audio frequency signal input having a general sinusoidal shape.

The modulation technique illustrated by the modulated signal of FIG. 2B corresponds to symmetry modulation in the time domain. More specifically, each upward transition of the pulse train in FIG. 2B occurs at exactly the same point as the up transition in the unmodulated signal of 2A. Thus the consecutive up transitions in both the unmodulated and modulated pulse trains represents the fixed repetition rate or clock rate of the pulse train. As may be appreciated by review of FIG. 2B, however, the down transition of each pulse, which defines the duration of the pulse, varies in response to the magnitude of the modulating signal. As will also be appreciated from inspection of FIGS. 2A and 2B the presence of the modulating signal alters the 50% duty cycle and thus alters the symmetry of the pulse train (thus giving rise to the name of symmetry modulation for the modulation technique illustrated).

Considering the specific pulses in FIG. 2B, the respective consecutive pulses correspond to a 0 voltage modulating signal, followed by an increasing magnitude modulating signal as represented by a longer duration pulse, followed by a 0 voltage modulation of signal, followed by a shorter duration pulse corresponding to a modulating signal below the 0 reference, followed by another 0 voltage pulse. The pulse train of FIG. 2B thus corresponds to a single period of a sine wave modulating signal.

The symmetry modulation approach in FIG. 2B is purely illustrative. As will be discussed in more detail below, other time variant modulation techniques may equally be employed. For example, pulse width modulation, pulse position modulation and pulse interval modulation may also be employed.

Referring again to FIG. 1, the repetitive pulse train produced by the TVM pulse generator provides a signal to the magnetic element driver circuit 22 which drives the magnetic transmitting element 14 with the pulse train. Magnetic element driver 22 provides the gain necessary to drive the transmitting magnetic element 14 for the specific application and magnetic element size and also preferably decouples the pulse generation unit circuitry from the transmitting element. For most short range applications, due to the effective coupling provided by the shared magnetic flux of the transmission magnetic element 14 and receiving magnetic element 16, a very low power driving signal will be adequate to provide the desired signal to noise level in the receiver 12. For example, for transmission over very short ranges such as less than one meter the power necessary to drive the transmitting magnetic element may typically be measured in milliwatts while at the same time providing a high signal to noise ratio. Also, for certain TVM approaches, such as pulse interval modulation discussed below, the dynamic range of the transmitted signal does not impact on the power consumption of the transmitter portion 10.

As further illustrated in FIG. 1, the receiver/transducer 18, TVM pulse generator 20 and magnetic element driver 22 are all powered by a power supply 24. Power supply 24 may be a battery in the case of a movable transmitter portion 10, and the low power consumption of the transmitter may provide a long battery life. Alternatively, in applications where the transmitter portion 10 is stationary, or configured in a room or auditorium, power supply 24 may be a transformer coupled to conventional AC mains.

Still referring to FIG. 1, the receiver portion 12 includes TVM pulse detector/demodulator 26 which receives the TVM pulse train induced in receiving magnetic element 16. Detector/demodulator 26 will vary with the specific TVM modulation technique employed but may typically be a circuit of relatively simple construction, low power consumption and low cost. Alternatively, the function of the demodulator can be accomplished by the transducer or speaker itself, thus requiring no other integrating or demodulating components. For example, as will be discussed in more detail below, in the case of pulse symmetry modulation as described above in relation to FIGS. 2A and 2B, a simple RC (resistor and capacitor) circuit, may serve to adequately demodulate the audio signal from the high repetition rate pulse train, by integrating the receiver signals to derive a signal related to the pulse duty cycle. In general, a low pass filter in combination with threshold detection and preamplification circuitry will be adequate for the detector/demodulator 26.

The output of the detector/demodulator 26, i.e., the transmitted audio frequency signal, is provided to audio driver 28 which may be a conventional audio amplifier circuit, which in turn drives speaker 30. Typically a low power speaker 30 will be employed for head worn receiver applications. Each of these components of receiver 12 in turn are powered by power supply 32 which will be a small battery in most applications. Due to the magnetic coupling of the receiving magnetic element 16 to the transmitting magnetic element 14, and the simple circuitry employed by the receiver a very low power consumption will be required by the receiver 12.

As noted above in Equation 5, for a simple loop transmission element geometry, there exists a direct relationship between diameter of the loop, the current, and the magnetic field, with the highest magnetic flux in the center of the loop. Furthermore, the magnetic field has an inverse relationship with distance. Typically the magnetic field falls to about 1–40% of the maximum value, at 1 loop diameter. These relations define an operational range for the magnetic coupling of the transmitting element and receiving element which is related to the loop current and loop size.

The relationship between loop current and magnetic field at various distances is illustrated in the following Table 1. Table 2 illustrates the relationship between loop size and magnetic field at various distances. The geometry for the measured values in the tables is shown in FIG. 3.

More specifically, FIG. 3 shows a circular magnetic element or loop, which lies in the X-Z plane (the Z axis extends out of the page). A graphical illustration of the measured field data of Table 1 versus distance and position relative to the center of the loop, is also provided in FIG. 3. The shape of the magnetic field is in general an elliptic paraboloid which extends along the +Y and −Y (not shown) axis.

The magnetic field shown in FIG. 3 illustrates the field strength as more uniform where the field is weakest (far field) compared to where the field is strongest (near field). The far field region may thus be advantageously exploited for communication in some applications.

Table 1 gives magnetic field strength in milliGauss (mG) for a 9 inch diameter single loop, driven by 4.6 mA at 10 V, using symmetry modulation with a repetition rate of 30 kHz.

Table 2 in turn illustrates measured magnetic field for different loop diameters as a function of distance from the plane of the loop along the axis of the loop (X=Z=0). The current was maintained substantially constant for loop diameters of 3½ inches, 7 inches, and 9 inches and was allowed to drop for the larger loop diameters to avoid circuit modifications for the larger loops. (That is, increasing loop size increases loop resistance, eventually requiring circuit modification to maintain current constant.) As in the case of the data of Table 1, the modulation technique was symmetry modulation and the TVM pulse repetition rate was 30 kHz.

In obtaining the measurements of Tables 1 and 2, the field strength meter pickup coil was oriented so its axis was at all times perpendicular to the plane of the loop to be measured. If the pickup coil is rotated 90 degrees, such that the axis of the pickup coil is parallel to the plane of the loop to be measured, the field strength in the center of the loop would be zero, as measured by the field strength meter. Moving the pickup coil radially outward in turn results in an increase in field strength, reaching a maximum at the perimeter of the loop, then a decrease with further distance radially outward.

For some applications, having high field strength or output at the center of the loop may not be desirable. Reorienting the demodulating magnetic element can therefore provide greater sensitivity at or near the perimeter of the loop.

TABLE 1

Magnetic Field (in MilliGauss)

|  | X = 0 | X = 1 | X = 2 | X = 3 | X = 4 | X = 4½ | X = 5 | X = 6 | X = 7 | X = 8 | X = 9 |
|---|---|---|---|---|---|---|---|---|---|---|---|
| Y = 0 | 37.2 | 40.2 | 44.8 | 50.8 | 42.4 | 6.1 | 12.1 | 10.6 | 5.7 | 3.0 | 1.4 |
| Y = 1 | 30.0 | 29.7 | 29.0 | 25.7 | 15.7 | 12.4 | 4.1 | 3.0 | 2.8 | 1.7 | 0.9 |
| Y = 2 | 25.7 | 23.6 | 21.5 | 17.6 | 11.8 | 8.2 | 4.8 | 2.4 | 0.8 | 0.6 | 0.4 |
| Y = 3 | 18.2 | 16.3 | 13.9 | 11.2 | 7.0 | 5.4 | 3.6 | 1.1 | 0.3 | 0.3 | 0.3 |
| Y = 4 | 12.7 | 12.1 | 10.6 | 7.9 | 5.4 | 4.5 | 3.3 | 2.1 | 0.3 | 0.3 | 0.2 |
| Y = 5 | 8.5 | 7.9 | 6.7 | 5.4 | 3.9 | 3.0 | 2.1 | 1.2 | 0.3 | 0.3 | 0.2 |
| Y = 6 | 5.7 | 5.4 | 4.5 | 3.8 | 2.9 | 2.5 | 2.0 | 1.0 | 0.3 | 0.3 | 0.3 |
| Y = 7 | 4.1 | 3.8 | 3.3 | 2.7 | 1.8 | 1.6 | 1.4 | 0.6 | 0.4 | 0.3 | 0.3 |
| Y = 8 | 2.9 | 2.7 | 2.2 | 2.4 | 1.4 | 1.2 | 1.1 | 0.5 | 0.4 | 0.3 | 0.3 |
| Y = 9 | 1.6 | 1.5 | 1.3 | 1.1 | 1.0 | 0.7 | 0.5 | 0.4 | 0.3 | 0.3 | 0.3 |
| Y = 10 | 0.9 | 0.8 | 0.6 | 2.5 | 0.4 | 0.4 | 0.4 | 0.3 | 0.3 | 0.3 | 0.3 |
| Y = 11 | 0.5 | 0.4 | 0.4 | 0.4 | 0.4 | 0.4 | 0.3 | 0.3 | 0.3 | 0.3 | 0.3 |
| Y = 12 | 0.4 | 0.4 | 0.4 | 0.4 | 0.4 | 0.4 | 0.3 | 0.3 | 0.3 | 0.3 | 0.3 |

|  | X = 10 | X = 11 | X = 12 | X = 13 | X = 14 | X = 15 | X = 18 | X = 21 |
|---|---|---|---|---|---|---|---|---|
| Y = 0 | 0.6 | 0.4 | 0.3 | 0.2 | 0.2 | 0.2 | 0.2 | 0.1 |
| Y = 1 | 0.5 | 0.2 | 0.2 | 0.2 | 0.2 | 0.2 | 0.2 | 0.1 |
| Y = 2 | 0.3 | 0.3 | 0.3 | 0.2 | 0.2 | 0.2 | 0.2 | 0.2 |
| Y = 3 | 0.3 | 0.2 | 0.2 | 0.2 | 0.2 | 0.2 | 0.2 | 0.2 |
| Y = 4 | 0.2 | 0.2 | 0.2 | 0.2 | 0.2 | 0.2 | 0.2 | 0.1 |
| Y = 5 | 0.2 | 0.2 | 0.2 | 0.2 | 0.2 | 0.2 | 0.2 | 0.1 |
| Y = 6 | 0.3 | 0.3 | 0.3 | 0.2 | 0.2 | 0.2 | 0.2 | 0.2 |
| Y = 7 | 0.3 | 0.3 | 0.3 | 0.2 | 0.2 | 0.2 | 0.2 | 0.2 |
| Y = 8 | 0.3 | 0.3 | 0.3 | 0.2 | 0.2 | 0.2 | 0.2 | 0.2 |
| Y = 9 | 0.3 | 0.3 | 0.3 | 0.2 | 0.2 | 0.2 | 0.2 | 0.2 |
| Y = 10 | 0.3 | 0.3 | 0.3 | 0.3 | 0.2 | 0.2 | 0.2 | 0.2 |
| Y = 11 | 0.2 | 0.2 | 0.2 | 0.2 | 0.2 | 0.2 | 0.2 | 0.2 |
| Y = 12 | 0.3 | 0.3 | 0.3 | 0.2 | 0.2 | 0.2 | 0.2 | 0.2 |

TABLE 2

| Y | LOOP DIAMETER 3½" LOOP CURRENT = 558 mA | LOOP DIAMETER 7" LOOP CURRENT = 582 mA | LOOP DIAMETER 9" LOOP CURRENT = 520 mA | LOOP DIAMETER 13" LOOP CURRENT = 455 mA | LOOP DIAMETER 18" LOOP CURRENT = 362 mA | LOOP DIAMETER 36" LOOP CURRENT = 234 mA |
|---|---|---|---|---|---|---|
| 0 | X = Z = 0 102.9 mG | X = Z = 0 48.7 mG | X = Z = 0 37.2 mG | X = Z = 0 18.2 mG | X = Z = 0 11.8 mG | X = Z = 0 1.7 mG |
| Y = 1 | 52.0 | 37.5 | 30.0 | 16.0 | 11.5 | 1.65 |
| Y = 2 | 23.6 | 26.0 | 25.7 | 13.6 | 10.1 | 1.6 |
| Y = 3 | 10.9 | 16.6 | 18.2 | 10.9 | 8.9 | 1.5 |
| Y = 4 | 5.1 | 10.0 | 12.7 | 8.4 | 7.6 | 1.4 |
| Y = 5 | 2.4 | 6.4 | 8.5 | 6.4 | 6.4 | 1.3 |
| Y = 6 | 1.0 | 3.9 | 5.7 | 4.7 | 5.2 | 1.2 |
| Y = 7 | 0.6 | 2.2 | 4.1 | 3.4 | 4.2 | 1.0 |
| Y = 8 | 0.5 | 1.2 | 2.9 | 2.3 | 3.3 | 0.9 |
| Y = 9 | 0.5 | 0.7 | 1.6 | 1.6 | 2.5 | 0.8 |
| Y = 10 | 0.5 | 0.5 | 0.9 | 1.1 | 1.9 | 0.7 |
| Y = 11 | 0.5 | 0.5 | 0.5 | 0.6 | 1.3 | 0.6 |
| Y = 12 | 0.5 | 0.5 | 0.4 | 0.5 | 1.0 | 0.5 |
| Y = 15 | 0.3 | 0.3 | 0.3 | 0.3 | 0.3 | 0.4 |

From the data in Table 2, it can be seen that as the loop diameter increases, the ratio of flux density in the plane of the loop to above the plane of the loop decreases. In other words, in a small diameter loop, the flux is concentrated mainly in the plane of the loop. As the diameter of the loop increases, more of the flux is above the plane of the loop.

Within allowable measurement error, Tables 1 and 2 show that the magnetic field strength (mG) drops to 1–10% of maximum at one loop diameter above or away from the center plane of the loop. More generally, at one loop diameter the field strength will be within 1–40% of the maximum value for most configurations.

Preferably, using the circuits illustrated, 0.3–0.5 mG (milliGauss) is desired for sufficient magnetic coupling of the receiving magnetic element to the transmitting magnetic element. The signal becomes noisy at 0.5 mG and becomes unusable at 0.3 mG. However, it should be appreciated that other transmission and receiving magnetic element configurations and dimensions, as well as other transmission modulating schemes, may provide greater sensitivity. Therefore loop drive current and loop size may be adjusted, along with the other parameters noted above, to provide a desired field strength at a desired operational distance for the specific application.

Figure 4:
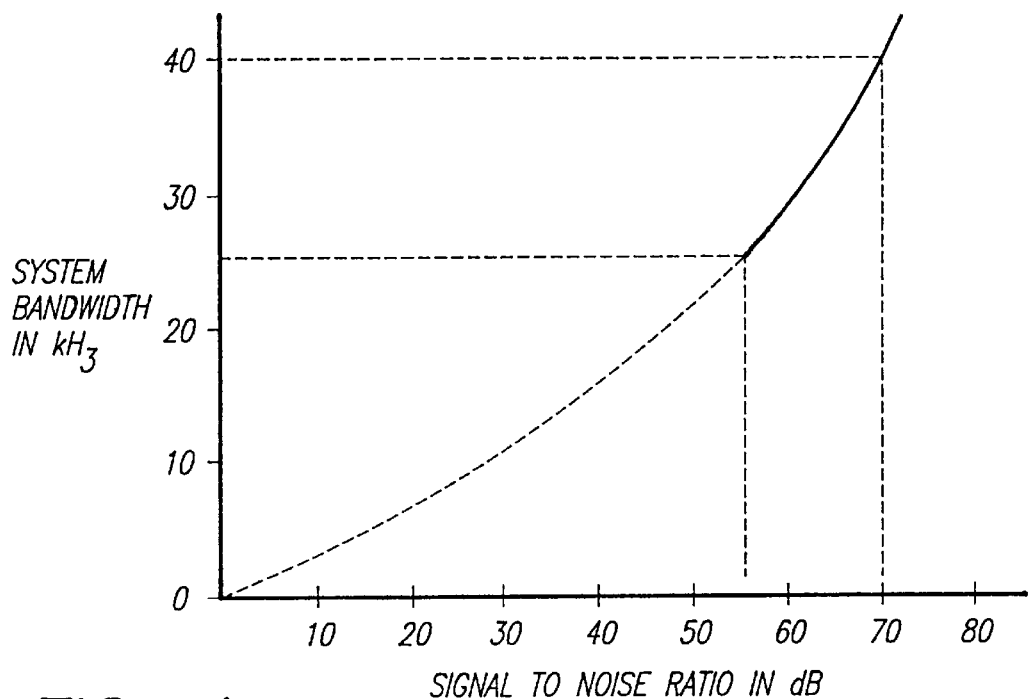
FIG. 4 is a graph illustrating the relationship between signal to noise ratio, bandwidth and modulation index for the wireless communication system of the present invention.

FIG. 4 shows the effect of the modulation index on the signal to noise ratio, as constrained by the system bandwidth. Modulation index is the ratio of the narrowest and widest pulse generated by the TVM pulse generator. The highest modulation index generally provides the best results for signal to noise ratio, linearity and distortion. For example, one practical circuit suitable for certain applications provides an 80% modulation index. The modulation index is limited by the receiver bandwidth. The system bandwidth is preferably optimized for best signal to noise ratio rather than to optimize the modulation index.

Referring to FIG. 5, a specific example of the TVM pulse generator 20 of FIG. 1 is illustrated where symmetry modulation of the pulse train is provided in response to the audio frequency modulating signal. In FIGS. 6A and 6B exemplary pulse trains are illustrated. In the symmetry modulation approach as illustrated, a repetitive substantially linear waveform of fixed repetition rate is modulated by the audio frequency input signal to generate a modulated pulse stream. The modulated pulses have a variable length duration, the variable length duration representing the encoded audio frequency signal, but a fixed repetition rate corresponding to that of the linear input waveform. Since the pulse repetition rate is constant but the pulse duration changes, the duty cycle must vary with the instantaneous magnitude of the modulating signal. For example, a sawtooth waveform, may be modulated by a slowly varying sine wave as shown in FIG. 6A, to generate a square wave pulse stream with changing duty cycle as shown in FIG. 6B.

As will be appreciated from inspection of FIG. 6B in comparison to the sine wave modulating the pulse stream of FIG. 6A, the 6B pulse train has a sequence of pulses of duration corresponding to the magnitude of the sine wave at that point with each pulse having a trailing edge defined by the clock rate of the sawtooth wave (the clock signals are denoted by $C_1$–$C_N$ in FIG. 6B). This clock rate defines the sampling rate of the audio input signal. As will further be appreciated from inspection of FIG. 6B, the pulses in FIG. 6B are of constant height, which height may be adjusted to provide the desired degree of noise immunity at the receiver portion.

Referring to FIG. 5, a TVM pulse generator circuit providing a symmetry modulated pulse train of the type illustrated in FIG. 6B, is shown. The TVM pulse generator employs a sawtooth waveform generator circuit 40 which generates a linear sawtooth waveform at the desired frequency, e.g., 10–100 kHz. Sawtooth waveform generator 40 may preferably employ a pulse generator 42 for providing repetitive pulse spikes of short duration, e.g., 3–5 microseconds, at the desired frequency. The pulses are provided to linear ramp generator 44 which generates the linear ramp portion of each sawtooth pulse at a repetition rate determined by pulse generator 42. The output of linear ramp generator 44 is a sawtooth waveform having the desired repetition rate which is provided along line 46 to voltage comparator 48. Voltage comparator 48 also receives the audio frequency signal provided from audio receiver/transducer 18 (shown in FIG. 1) along line 50. Comparator 48 compares the two inputs provided along line 46 and line 50 respectively and provides a two level output pulse stream along line 52 corresponding to the comparison result.

For example, considering the signals illustrated in FIG. 6A as the inputs to the comparator 48, as the linear portion of the sawtooth ramp begins to rise, e.g., from zero volts DC, the comparator 48 will output a zero DC value as represented by the initial zero value of pulse train 6B. As the linear ramp portion of the sawtooth waveform increases above the sine wave, however, the comparator output will go high providing a DC output voltage $V_H$ as further illustrated in FIG. 6B. When the sawtooth waveform reaches the end of its linearly increasing ramp portion and drops suddenly to zero volts DC once again, as illustrated in FIG. 6A, it transitions below the magnitude of the sine wave modulating input causing the output of the comparator 48 to transition low as illustrated in FIG. 6B. Since the time which the linearly increasing sawtooth waveform is above (or below) the modulating signal corresponds to the time during which the comparator 48 output is high (or low) it will be appreciated that the comparator output pulse train provides a modulated pulse train corresponding in the time domain to the magnitude of the input modulating signal.

It will be appreciated by those skilled in the art that the threshold at which the comparator 48 transitions between low and high may be set as desired for the specific application. Alternatively, the transition level may be modified by altering the magnitude of the sawtooth output provided from sawtooth waveform generator 40. Also, it will be appreciated that while the sawtooth waveform illustrated in FIG. 6A provides well defined clock signals $C_1$–$C_N$ on the downward portion of the pulse train, a sawtooth waveform having a linearly decreasing ramp portion and a sharply increasing leading portion may equally be employed, which would provide a well defined clock transition at the beginning of each square wave pulse train. Further, it will be appreciated by those skilled in the art that while idealized waveforms are illustrated in FIGS. 6A and 6B, corresponding to idealized sawtooth waveforms and idealized square waves, in practice they will be rounded or otherwise vary from the idealized shape, while still providing the advantages of the present invention.

Furthermore, various other modifications may be made while remaining within the scope of the present invention. For example, the ramp rate of the sawtooth waveform illustrated in FIG. 6A may be widely varied, while retaining the linear nature of the ramp portion thereof, as desired for the specific application while maintaining the advantages of the present invention. Furthermore, the values of the low and high comparator output voltages $V_0$ and $V_H$ may be varied as desired for the specific application. Preferably, however a relatively low value of $V_H$, e.g., 1 volt is provided by the comparator, and the pulse height is adjusted for transmission by the subsequent magnetic element driver circuitry 22 shown in FIG. 1, to provide the pulse magnitude suitable for a desired signal to noise ratio in the receiver portion of the system. Also, the output of comparator 48, may be inverted relative to that illustrated so that the positive portion of the pulse train duty cycle corresponds to the magnitude of the modulating signal, as opposed to the negative portion as illustrated.

Referring to FIG. 7, the TVM pulse detector/demodulator 26 employed in the receiver portion 12 of the communication system of the present invention is illustrated in a block schematic diagram. As will be appreciated from review of FIG. 7, the detector/demodulator is a relatively simple analog circuit and such simplicity is a significant advantage of the short range communication system of the present invention.

As shown, the detector/demodulator 26 includes a preamplification circuit 60 which is directly coupled to the receiving magnetic element 16. Preamplifier 60 may be a commercially available component which is tuned for the specific receiving magnetic element 16, to provide the desired degree of preamplification to the input signal provided by the receiving loop. Preamplifier 60 provides the amplified output from the receiving magnetic element 16 to pulse detector 62. Pulse detector 62 discriminates transmitted pulses in the modulated pulse train provided from the preamplifier 60 from background noise. The output of detector 62 thus corresponds to the transmitted high repetition rate modulated pulse train with transmission noise substantially eliminated.

The pulse train is provided by detector 62 to demodulator circuit 64 which discriminates the audio frequency modulating signal from the high repetition rate pulse train. Since, in the case of symmetry modulation, the duty cycle of the pulse train corresponds to the encoded audio signal; it may be recovered by integrating the pulse train. A simple integration circuit may thus suffice for demodulator 64. More generally, demodulator 64 may operate as a band pass filter to discriminate the audio frequency modulating signal from the high repetition rate pulse train. While such band pass filters are commercially available, a suitable analog filtering system may be readily constructed using discrete components as will be discussed in more detail below.

The output of demodulator 64 is thus the reconstructed audio frequency modulating signal initially provided from the audio input receiver/transducer 18, of FIG. 1. This demodulated signal is then provided to the audio output driver 28 for amplification, which circuit may be of any suitable design constructed in a manner well known to those skilled in the art.

Figure 8:
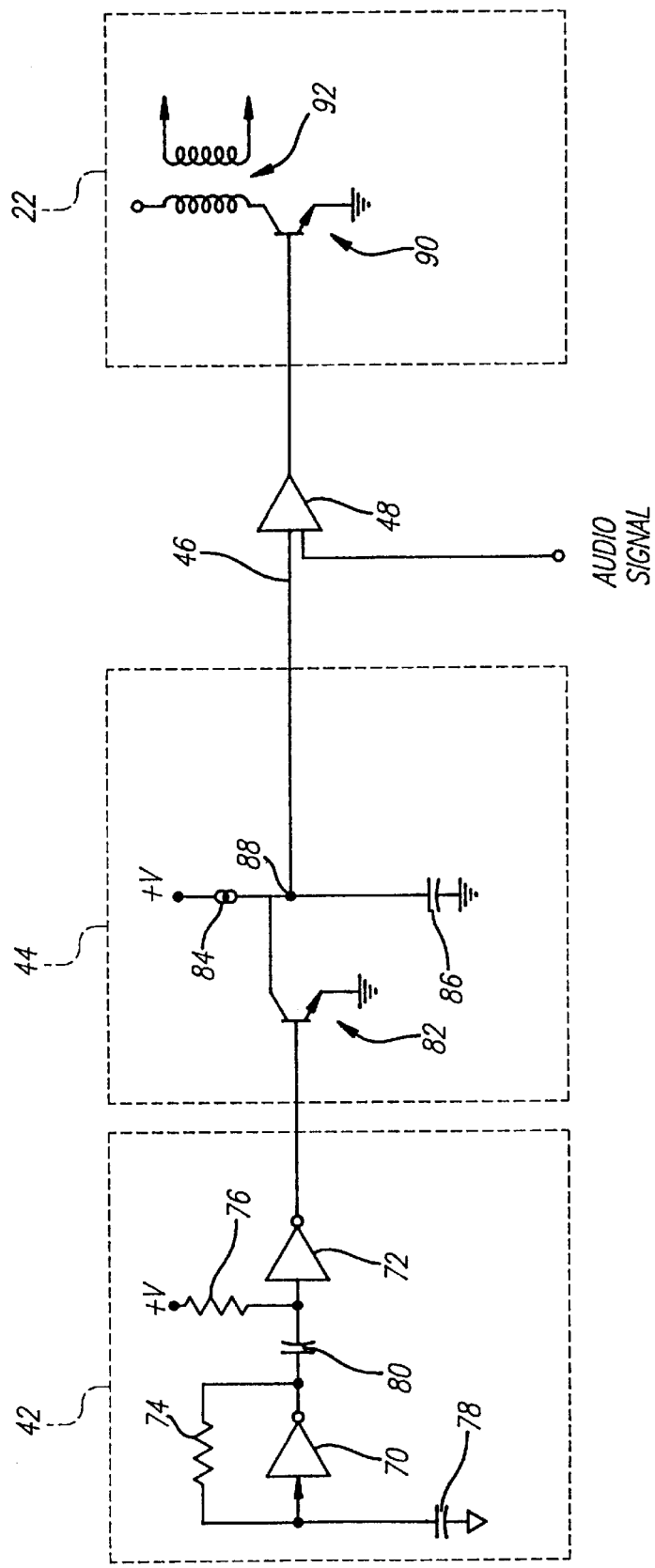
FIG. 8 is an electrical schematic diagram illustrating the modulator circuit of FIG. 5 in more detail.

Referring to FIG. 8, a preferred embodiment of the TVM pulse generator circuit 20 is illustrated in a detailed schematic drawing. As discussed previously in relation to FIG. 5, the TVM pulse generator employed for a symmetry modulation implementation includes a high repetition rate pulse generator 42 which provides a sequence of pulses at a fixed frequency. As illustrated, in one embodiment the pulse generator 42 may comprise a coupled free running multivibrator and monostable, employing first and second inverters 70, 72 respectively, to generate a repetitive pulse sequence. The repetition rate of the pulses provided by the multivibrator/monostable circuit may be adjusted by use of first and second resistors 74, 76 and first and second capacitors 78, 80. These resistors and capacitors, in conjunction with delay times of inverters 70, 72, may be used to adjust the repetition rate of the pulse generator 42 between 10 kHz and 1 MHz or even higher if desired. Preferably, however, the range will be chosen to lie between 10 kHz and 100 kHz. Alternatively, the free running multivibrator/monostable circuit illustrated in FIG. 6 may be replaced with other well known sources of high repetition rate pulses, for example crystal oscillators, phase locked loops, etc. The entire timing circuit may also be self contained in a monolithic I.C. It is also possible to derive a clock signal from an external source.

Still referring to FIG. 8, the output of the pulse generator 42 is provided to the linear ramp generator circuit 44. As illustrated, the ramp generator 44 employs a timing capacitor 86 and a reset or discharge transistor 82. Reset transistor 82 receives the output of invertor 72 at the base thereof. Each pulse from the pulse generator circuit 42 applied to reset transistor 82 turns it on and resets the ramp circuit voltage to 0 volts DC by discharging capacitor 86 to ground. The slope of the linearly increasing ramp signal is determined by constant current generator 84 and timing capacitor 86. After each reset pulse, current generator 84 in combination with capacitor 86 will cause the voltage at node 88, and hence the voltage applied to voltage comparator 48, to increase linearly as the capacitor is charged by the current generator to a maximum, e.g., 1 volt. The next consecutive pulse then pulls the voltage at node 88 back down to ground causing the sharp down transition of the sawtooth waveform. It will thus be appreciated that the sawtooth ramp generation circuit of FIG. 8 provides a readily implemented and low cost circuit.

Voltage comparator 48 in turn may be a commercially available comparator circuit which is manufactured by a wide variety of manufacturers. Comparator 48 compares the instantaneous voltages from the ramp generator and the input signal. The output of comparator 48 is either high (e.g., 1 volt) or low (e.g., 0 volts), depending on the comparison result.

Also shown in FIG. 8, is a preferred embodiment of the magnetic element driver circuit 22. This circuit employs a current amplifier which may be an amplifying transistor 90, which responds to the state of the comparator 48 output. When the comparator output is high transistor 90 causes current to flow through isolation transformer 92. When the comparator output is low, no current flows through transformer 92. The output of transformer 92 is in turn provided to the transmitting magnetic element 14. Transformer 92 isolates the transmission magnetic element 14 from the rest of the transmitter circuitry. The power required to drive the transmitting magnetic element 14 while in general will be quite low for short range applications, e.g., to a headworn receiver, but certain applications may require more power, for example where a room or other enclosed area is encircled by the transmitting magnetic element to allow transmission to a large number of receiving units within the closed area.

The foregoing schematic drawing illustrated in FIG. 8 provides a simple and relatively low cost implementation of a TVM pulse generator circuit, which may be implemented as a single IC, as will be discussed in more detail below. It will be appreciated however, that alternate approaches may be employed. For example, the circuitry of FIG. 8 may be replaced with a microprocessor programmed to provide the desired pulse train in response to an audio frequency input signal. Also, while the circuitry of FIG. 8 may be implemented in a embodiment employing discrete components, it will be appreciated by those skilled in the art that all or a portion of the circuitry may be embodied in an integrated circuit chip providing a more compact embodiment of the illustrated circuitry.

Referring to FIG. 9, a schematic drawing of a preferred embodiment of the detector/demodulator circuit 26 is illustrated in an embodiment adapted for use with a symmetry modulation based system. The components illustrated in FIG. 9 generally correspond to those discussed above in relation to FIG. 7 and like numerals are employed.

More specifically, as shown in FIG. 9, the preamplification circuitry may employ a combination of a commercially available preamp circuit 100 in conjunction with a load resistor 102 and a DC blocking capacitor 104. The load resistor 102 matches the electrical parameters of the receiving magnetic element 16 and the preamplification system. The blocking capacitor 104 provides DC isolation between the magnetic element 16 and preamplification circuit 60. The output of the preamplification circuit 60 is provided to the pulse detector circuit 62 which includes a threshold detector 106 which receives the amplified modulated pulse train signal at the input thereof along line 108. Threshold detector 106 discriminates pulses in the pulse train from background noise.

The output of threshold detector 106 is a constant value output when the input signal exceeds the detection level and zero otherwise. This output pulse train is then provided to demodulator circuit 64 which separates the audio frequency modulating signal from the pulse train. As illustrated, a simple resistor-capacitor circuit may suitably discriminate the audio frequency signal from the pulse train in the case of a symmetry modulated pulse train by integrating the pulse train signal and providing an output signal corresponding to the instantaneous duty cycle of the pulse train. The specific values of resistor 110 and capacitor 112 are chosen to provide the desired time constant to filter only the high frequencies.

It will thus be appreciated that the detector/demodulator circuit illustrated in FIG. 9 is an extremely simple analog circuit which can be readily implemented in an inexpensive and compact manner readily adapted for a portable receiver. Thus, the symmetry modulation approach for which the illustrated detector/demodulator is adapted has the advantages of a low cost and compact receiver unit suitable for headset or hearing aid receivers or other small receiver applications. Also symmetry modulation provides superior dynamic range, a recoverable clock, good linearity, frequency independence, DC coupled transmitter and receiver, and up to 80% modulation level.

Referring to FIG. 10A, a preferred embodiment of the threshold detector 106 employed in the detector/demodulator circuit of FIG. 9 is illustrated in a schematic drawing. As will be appreciated from inspection of FIG. 10A, the threshold detector is a relatively simple circuit. Further, the illustrated circuit has advantages over more conventional threshold detector circuits, typically employing a reference voltage and comparator, in that it is not susceptible to DC drift and does not require a reference voltage setting circuit. This thus provides a threshold detector circuit which is well suited for eliminating noise from transmitted pulses and which avoids problems such as limited dynamic range associated DC drift and pulse asymmetry associated with a reference voltage and comparator approach.

As shown in FIG. 10A, the threshold detector circuit employs first, second and third bipolar transistors 180, 182 and 184, respectively. These transistors are coupled in parallel between the positive voltage supply (+V) and ground thereby defining three current legs. The first bipolar transistor 180 acts as an input and receives the input signal provided from the preamp circuit 60 at the base thereof, via first resistor 186 and bias capacitor 188. As will be discussed in more detail below, bias capacitor 188 acts in conjunction with bias resistor 189 as a threshold setting element for the turn on of transistor 180. As further illustrated in FIG. 10A, each of the current legs corresponding respectively to first, second and third transistors, 180, 182 and 184, includes a resistor; resistors 190, 196, and 198 respectively. The bottom portion of the current legs in turn are coupled to ground via resistors 192 and 194. Thus, these resistors, 190, 192, 194, 196, and 198 balance the circuits to provide the desired output from node 200, with feedback to bias capacitor 188 through transistor 180.

In operation it will be appreciated that the input transistor 180 and the middle transistor 182 are complementary; i.e., either transistor 180 or transistor 182 may be conducting at any time but not both since when transistor 180 is turned it will short the base/emitter junction of transistor 182. During the static condition, i.e., where no signal is being input to the threshold detector circuit, bias resistor 189 allows capacitor 188 to become charged to a threshold voltage which turns on input transistor 180. Transistor 182 is then turned off by transistor 180, as noted above. Transistor 184 is then turned on, pulling output node 200 to ground and providing a low output as desired.

In the operational mode, the modulated pulse train is provided to the input of the threshold detector circuit, and to bias capacitor 188. This supplies a voltage to transistor 180 which moves up and down with the input signal as adjusted by the bias capacitor 188. This causes the transistors 180 and 182 to alternately conduct and drive output transistor 184 to provide a bi-level output at node 200. The biasing of transistor 180 by biasing capacitor 188 and biasing resistor 189 maintains a constant voltage across of the base to emitter junction of transmitter 180. Since the base to emitter voltage is constant, the voltage developed across resistor 194 by the output leg charges up the capacitor 188 such that the pulse generated across resistor 194 is symmetrized. Since the current across resistor 194 represents the output signal at the collector of output transistor 184, the output signal at node 200 is also symmetrized. This feedback action which is provided via resistor 194 and the base/emitter junction of input transistor 180 to the bias capacitor 188, compensates for DC drift which would otherwise occur in a typical threshold detection circuit.

Figure 10B:
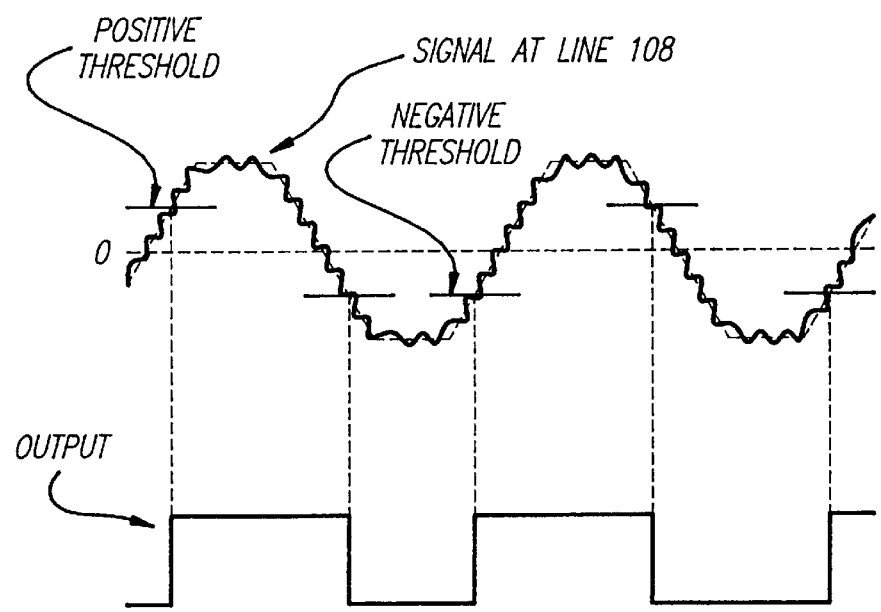
FIG. 10B is a waveform diagram illustrating the operation of the circuit of FIG. 10A.

Referring to FIG. 10B, an illustrative waveform provided by the detector circuit of FIG. 10A is shown. As shown, there are two threshold levels provided, one for positive transitions and the other for negative transitions. The feedback provided by resistor 194 restores the bias of the bias capacitor 188 such that the output of the circuit is always symmetrized between the positive and negative transitions. This bias restoration has a time constant which may be set as desired for the specific application by setting the values of resistor 194 and bias capacitor 188. For example, a time constant of about 500 milliseconds is suitable for a pulse train time domain modulated by an audio frequency signal since any signal frequencies higher than 2 Hz will be passed through the detector circuit to the output.

Although the threshold detector circuit described in FIGS. 10A and 10B is presently preferred, it will be appreciated by those skilled in the art that more conventional threshold detectors may also be employed. Such detectors typically would employ a reference voltage setting circuit and a comparator, the comparator receiving one input from the reference voltage circuit and the other from the input modulated pulse train. Those pulses exceeding the reference voltage would then be detected as a pulse and noise would be discriminated. While this has the added complexity of a reference voltage setting circuit and the problems noted above of DC drift and asymmetry between positive and negative pulses, commercially available circuits are available providing such threshold detection for higher voltage applications (e.g. 3–5 volts) and may be advantageous for certain applications for this reason.

Figure 11A:
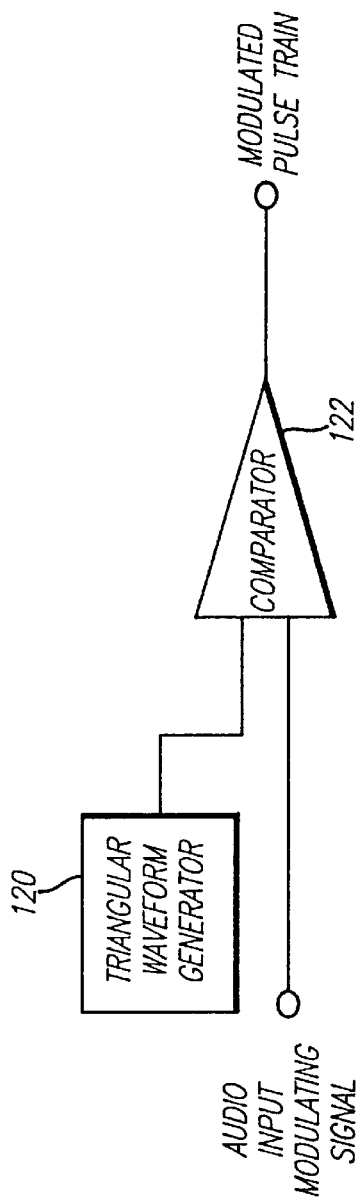
FIG. 11A is a block diagram of a TVM pulse generator circuit in accordance with an alternate embodiment employing pulse width modulation in the transmitter portion of the short range communication system of FIG. 1.
Figure 11B:
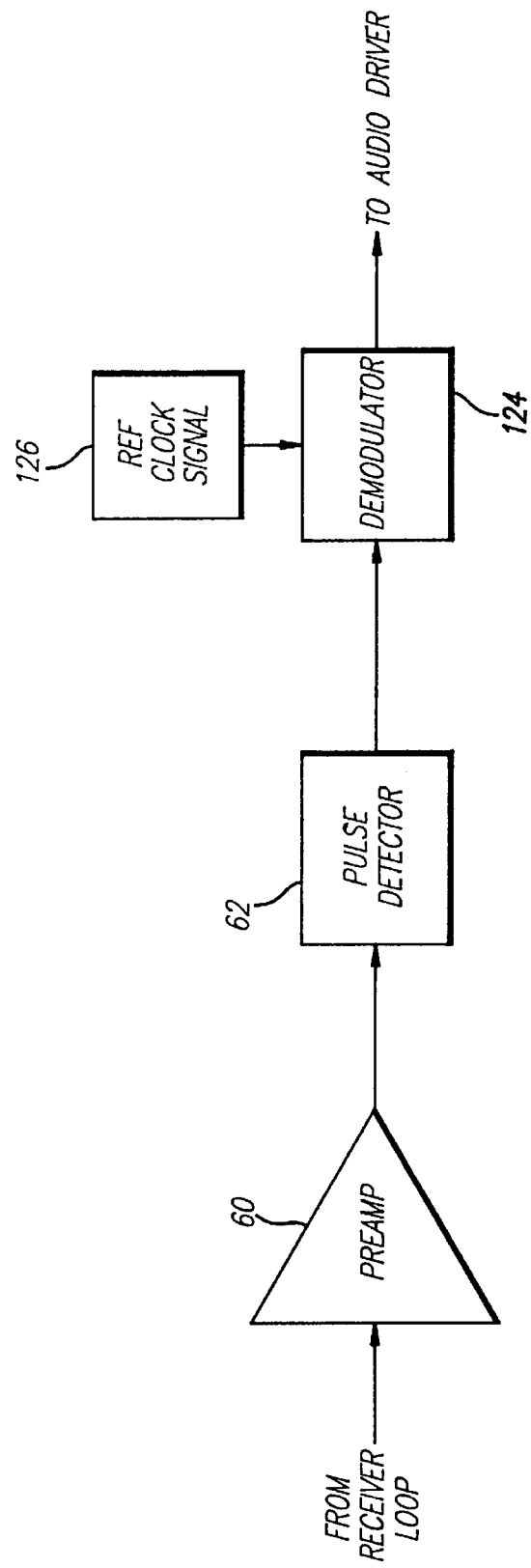
FIG. 11B is a block diagram of the detector/demodulator circuit of the system of FIG. 1 in an embodiment employing pulse width modulation.

Referring to FIGS. 11A and 11B, the TVM pulse generator 20 and the TVM pulse detector/demodulator 26 of the system of FIG. 1 are illustrated in block schematic form for an alternate embodiment employing pulse width modulation. In FIGS. 12A and 12B examples of encoding waveforms and transmitted pulse trains are illustrated. In pulse width modulation, the pulse width of the pulse train is proportional to the instantaneous value of the input signal and the repetition rate is equal to the sampling rate.

More specifically, referring to FIGS. 11A and 12A and B, the TVM pulse generator 20 includes a triangular waveform generator 120 which generates a waveform such as illustrated in FIG. 12A. This triangular waveform is provided to one input of comparator 122 which receives the audio frequency input signal at the other input thereof. As in the case of the pulse symmetry modulation embodiment described above, the comparator 122 compares the linear waveform, i.e, the triangular wave in this embodiment, with the audio input signal and generates a substantially square wave output pulse train with transitions at the crossings of the audio and triangular wave values as indicated in FIG. 12B. As in the case of pulse symmetry modulation described previously, the duration or pulse width of the square wave pulse train of FIG. 12B corresponds to the (inverse) magnitude of the audio frequency signal. The square wave pulse train of FIG. 12B differs from that of pulse symmetry modulation, however, in that the square wave pulse width extends on both sides of the clock pulses $C_1$–$C_N$ which are represented by the transitions of the linear portions of the triangle waveform.

The presence of the audio information in the pulse of FIG. 12B on both sides of the clock signal can provide advantages due to noise cancellation where the signal levels are relatively small and require a small percentage of the modulation index. However, due to the lack of a well defined transition in the transmitted pulse train to define a clock signal, the demodulator circuitry must be somewhat more complex than that in the pulse symmetry modulation embodiment described previously. A further practical potential advantage of the pulse width modulation scheme illustrated in FIGS. 11A and 11B is that commercially available components are available which generate a pulse width modulated signal. For example, the commercially available LM555 chip manufactured by National Semiconductor and many others may be employed for a portion of the circuitry illustrated in FIG. 11A. Alternatively, however, a suitable pulse width modulation circuit can be constructed along the lines of the sawtooth waveform generator and comparator illustrated in FIG. 8 for the case of symmetry modulation.

Referring to FIG. 11B, a block diagram of the detector/demodulator circuit 26 is illustrated for the pulse width modulation implementation. As illustrated the detector/demodulator 26 includes a preamplification circuit 60 and pulse detector 62 which may correspond to the matching circuits described in relation to FIGS. 7 and 9 discussed previously and like numerals are employed. The demodulator circuit 124, however differs, from that described previously in that a simple integration scheme using an RC circuit will not provide optimal dynamic range due to the absence of well defined clock pulses in the transmitted pulse train. Accordingly, a source of clock signals 126 is preferably provided, which clock signals are synchronized with those of the triangular waveform generator 120. That is, if the original triangular waveform generator provides a 30 kHz pulse, the clock signal generator 126 will provide 30 kHz reference clock signals. This allows DC voltage coordination of the transmitting portion and receiving portion of the communication system to prevent DC drift of the receiver and potential reduction in audio quality.

Referring to FIG. 13 and FIGS. 14A, 14B and 14C, an alternate embodiment of the TVM pulse generator 20 of the transmission system of FIG. 1 is illustrated in block schematic and timing diagrams, respectively. In the embodiment illustrated in FIGS. 13 and 14A–C, pulse position modulation is employed to encode the audio frequency signal to be transmitted.

In pulse position modulation, a square wave pulse train such as provided in pulse symmetry modulation or pulse width modulation, is converted to a series of very short duration pulses which define the beginning and ends of the square wave pulses. These short duration pulses are then transmitted between the inductively coupled transmitting and receiving magnetic elements and then converted back to a square wave pulse train at the receiver. This has the advantage of providing a low duty cycle, high peak but low average power pulse train which can significantly reduce battery drain. For more noisy environments, the relatively high short duration pulses can be used to provide efficient detection despite transmission loss or otherwise noise problems. Also, since the pulses which are transmitted are all preferably of equal width, a narrow bandwidth detector may be employed in the receiver circuitry.

More specifically, referring to FIGS. 14A and 14B, the initial linear pulse train is shown as a triangular waveform which is used to compare a input audio frequency signal, indicated as a sine wave in FIG. 14A, to provide a square wave output pulse train. This corresponds to the case of pulse width modulation transmission. Alternatively, a pulse symmetry modulation approach may be employed and the linear waveform illustrated in FIG. 14A may be replaced with a sawtooth waveform with a concomitant modification of the square wave pulse train of FIG. 14B. In FIG. 14C, the square wave pulses of FIG. 14B have been replaced with short duration pulses corresponding to the leading and trailing edges of the square wave pulses of FIG. 14B. It will be appreciated that since the audio signal information encoded in the waveform of FIG. 14B is contained in the width of the pulses shown therein, the short pulses of FIG. 14C which define the beginning and ends of the pulses of FIG. 14B, contain the same information encoded therein. Thus, the short duration pulses of FIG. 14C may be transmitted in place of the wider pulses of FIG. 14B without any loss of information but with a reduction in the duty cycle and power consumption of the transmission circuit.

Referring to FIG. 13, the TVM pulse generator 20 employed in the pulse position modulation approach may employ a linear waveform generator 130 which provides an output waveform to comparator 132 which receives the audio frequency signal at the other input thereof. As noted above, the linear waveform generated by linear waveform generator 130 may be a sawtooth waveform in the case of a pulse symmetry modulation approach to generation of the square wave or may be a triangular waveform if pulse width modulation encoding is desired. The corresponding square waveform output from comparator 132 is then provided to differentiator circuit 134 which discriminates the leading and trailing edges of the square wave pulses in the pulse train. A relatively simple circuit may be employed for the differentiator 134, for example a resistor and capacitor network may suitably discriminate the edges of the pulses. The output of differentiator 134 is provided to a pulse forming circuit 136 which creates the very short duration pulses such as illustrated in FIG. 14C. For example, 3–5 microsecond pulses may be provided by pulse forming circuit 136. Pulse forming circuit 136 may for example be a one shot monostable, commercially available, device. The output of pulse forming circuit 136 is in turn provided to the transmitting magnetic element 14 via magnetic element driver 22 in a manner as illustrated in FIG. 1 as described above.

Referring to FIG. 15, a detector/demodulator circuit 26, suitable for use with a pulse position modulation implementation of the present invention, is illustrated. As noted above, since the short duration pulses transmitted in a pulse position modulation approach may be of higher peak magnitude, while still drawing less power than a symmetry modulation or pulse width modulation approach, the noise discrimination may be increased by setting a higher threshold in the pulse detector circuit 138. This circuit receives the transmitted pulse position modulated signals from a preamp circuit 60 which may function in a manner as described previously for other detector/demodulator implementations. The output of the pulse detector 138 substantially corresponds to the transmitted pulse sequence as illustrated in FIG. 14C. This pulse train is provided to flip flop 140, which may for example be a commercially available RS flip flop, which converts the pulse train back to a form such as illustrated in FIG. 14B. This converted pulse train is in turn provided to a demodulator circuit 142 which may correspond to the demodulator circuit 64 discussed previously in relation to FIG. 9 if a symmetry modulation transmission is employed or may correspond to the demodulator circuit 124 if pulse width modulation is employed, as discussed in relation to FIG. 11B. The output of demodulator 142 will thus be the restored audio frequency signal originally applied to the input of comparator 132 (referring to FIG. 13).

Referring to FIGS. 16, 17A–C, and 18, an alternate embodiment of the TVM transmission system is illustrated employing pulse interval or pulse distance modulation. In the illustrated approach, as in the case of pulse position modulation described previously, very short duration pulses are transmitted, to obtain the benefit of low power consumption, good noise discrimination capabilities, and wide dynamic range.

Figure 16:
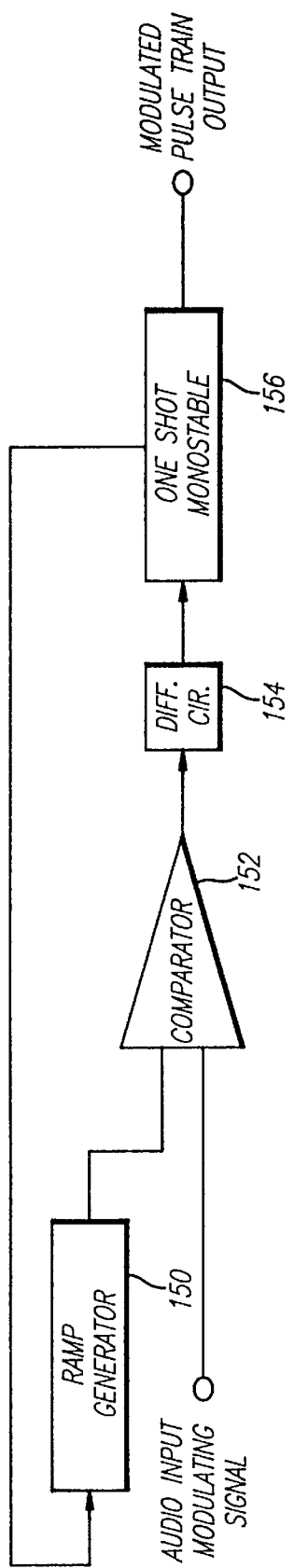
FIG. 16 is block diagram of a TVM pulse generator circuit in accordance with yet another embodiment of the present invention employing pulse interval modulation in the transmitter portion of the short range communication system of FIG. 1.

As in the case of pulse position modulation, the TVM pulse generator circuit 20 illustrated in FIG. 16 employs a linear waveform generator 150 which may generate any of a sawtooth, triangular, or other linear repetitive waveform, the output of which is provided to one input of comparator 152 which receives the audio frequency signal to be transmitted at the other input thereof. Also, as in the case of the pulse position modulation approach described previously, the output of the comparator 152 is provided to a differentiator circuit 154, the output of which is then provided to a pulse forming circuit 156, which may similarly be a one shot monostable circuit. Unlike the pulse position modulation approach described previously, however, the output of the pulse forming circuit 156 is fed back as an input to the linear waveform generator circuit 150 to alter the repetition rate of the linear waveform generated thereby.

Figure 17A:
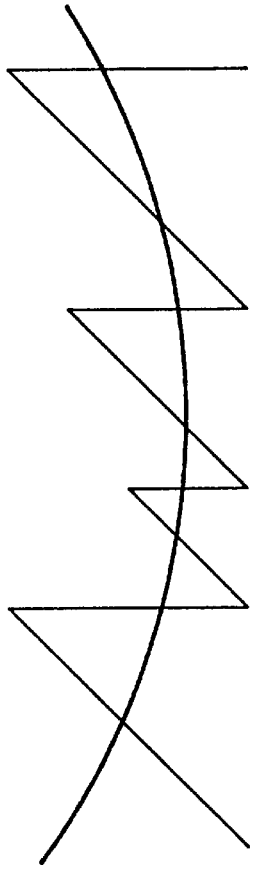
FIGS. 17A, 17B and 17C are timing diagrams illustrating an input signal modulating a sawtooth waveform, the pulse transitions, and a resulting pulse train with constant width and variable interval, respectively, provided by the circuit of FIG. 16.
Figure 17B:
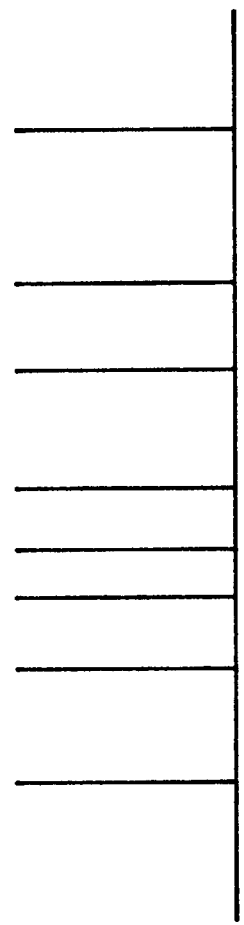
Figure 17C:
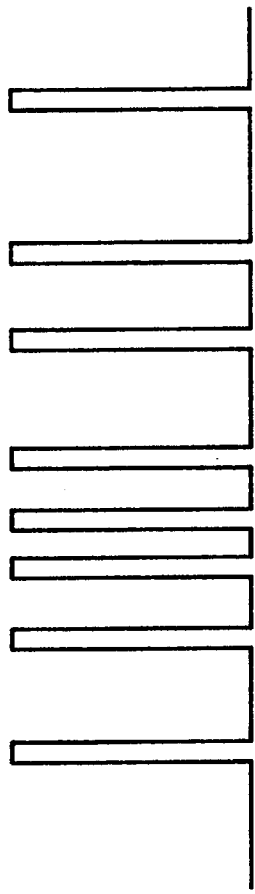

For example, in the case of a linear sawtooth waveform generated by linear waveform generator 150, a variable repetition rate output sawtooth pulse train such as illustrated in FIG. 17A would be generated. Output pulse trains of short duration pulses as illustrated in FIG. 17B and 17C then in turn would be generated by comparator 152 and pulse forming circuit 156. As will be appreciated from inspection of FIG. 17C, the pulse train employs very short duration pulses for magnetic element transmission, thereby providing high peak, but low average power consumption. Also, a very wide dynamic range may be readily transmitted since the interval between consecutive pulses only varies as the dynamic range is increased while the total power consumption remains the same.

Figure 18:
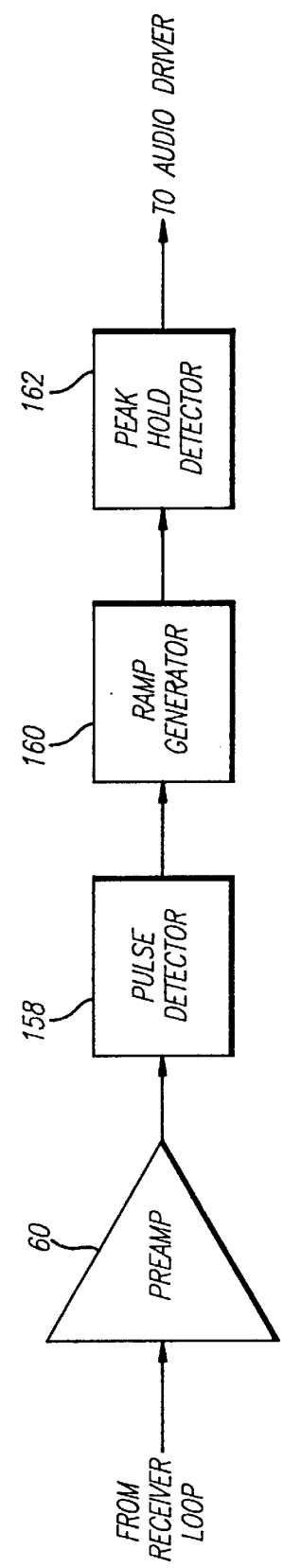
FIG. 18 is a block schematic diagram of a detector/demodulator circuit in accordance with the embodiment of the present invention employing pulse interval modulation.

Referring to FIG. 18, the detector/demodulator circuitry employed for the system employing pulse interval modulation is illustrated. As shown, the received pulse train signal is amplified by preamplification circuit 60 which may operate in a manner as previously described. The output of preamplification circuit 60 is provided to a pulse detector 158 which discriminates the transmitted pulses from background noise which in turn provides the output to ramp generator 160 and peak and hold detector 162. These operate in combination to reproduce the original audio frequency input signal.

Figure 19:
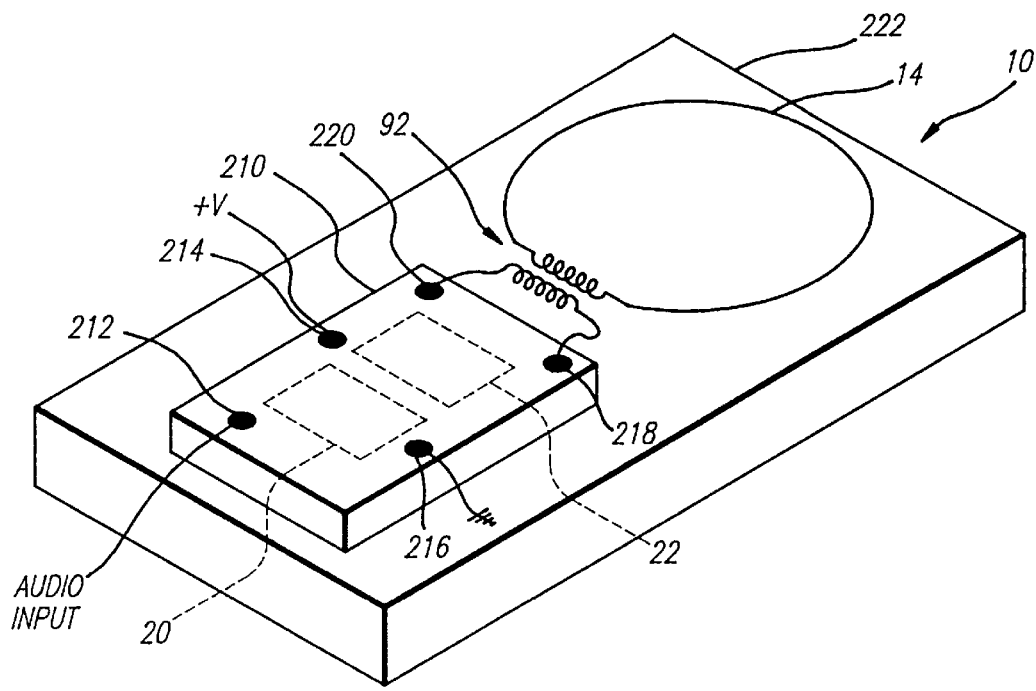
FIG. 19 is a perspective drawing of a preferred implementation of the transmitter portion of the wireless transmission system of the present invention employing a monolithic integrated circuit and thick film transmission loop mounted on a circuit board.

Referring to FIG. 19, a preferred implementation of the transmitter portion 10 of the transmission system of the present invention is illustrated. As shown schematically in FIG. 19, the TVM pulse generator circuit 20 and a portion of the loop driver circuitry 22 are preferably implemented in a single monolithic integrated circuit ("IC") chip 210. (The portion of the loop driver circuit 22 forming isolation transformer 92, which is optionally employed where the drive current to the loop is sufficiently high to require isolation from the IC 210, will normally be incompatible with IC fabrication.)

As illustrated schematically in FIG. 19, the monolithic IC 210 employs an audio input contact 212 which receives the audio input signal from an external audio signal source. IC 210 also has positive and negative (ground) voltage contacts 214 and 216, respectively, and output contacts 218 and 220 for coupling to the isolation transformer 92. As further illustrated in FIG. 19, for smaller transmission loop 14 sizes, the monolithic IC 210 and loop 14 may be mounted together on a printed circuit board 222. For example, the transmission loop 14 may be a thick film conductive loop found on the circuit board and connected to the output portion of the isolation transformer 92. This thus provides a very compact and readily manufactured transmission portion 10.

The provision of the major electrical components of the transmission portion 10 in a single monolithic IC 210, in particular, has significant cost advantages over prior wireless communication systems. These prior systems have been incompatible with a single monolithic IC transmission circuit due to various components which cannot really be implemented in such a circuit. This thus provides the transmission system of the present invention with a significant cost and space advantage over prior systems.

Figure 20:
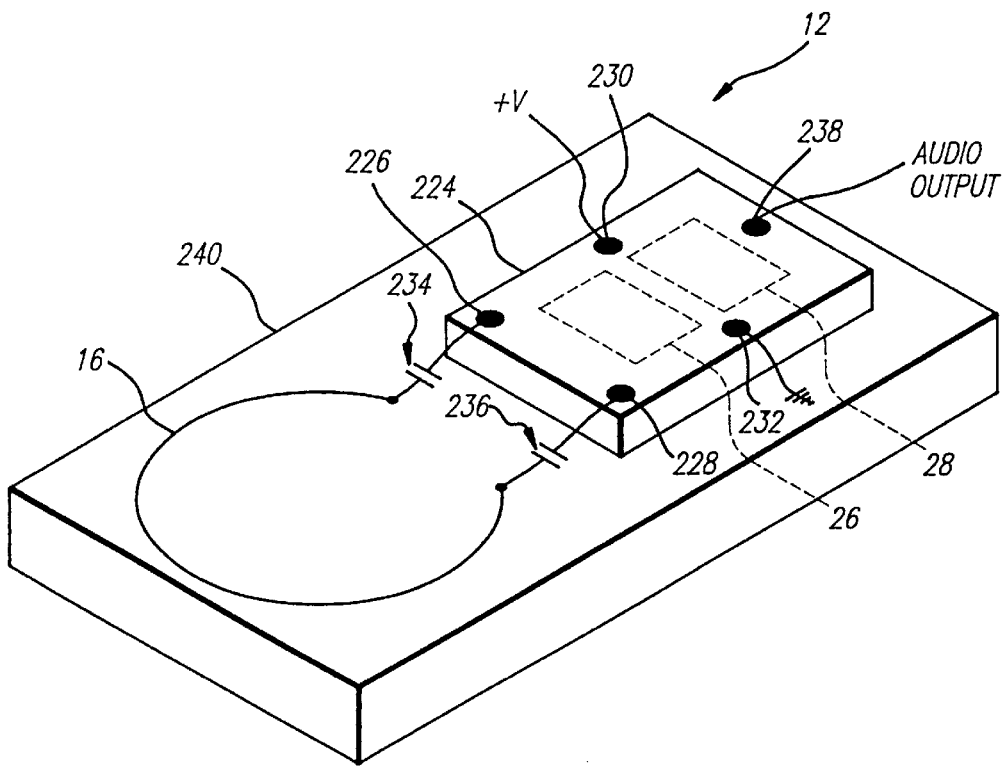
FIG. 20 is a perspective view of a preferred implementation of a receiver portion of the transmission system of the present invention employing a monolithic integrated circuit and receiving loop mounted on a circuit board.

Referring to FIG. 20, a preferred implementation of the receiver portion of the transmission system of the present invention is illustrated also employing a single monolithic IC 224 for the receiver portion 12. As illustrated schematically in FIG. 20, the monolithic IC 224 preferably includes the detector/demodulator circuitry 26, and optionally the audio driver circuit 28, in a single compact chip configuration. The chip 224 has first and second contacts 226, 228 for coupling to the receiving loop 16 and positive voltage (+V) and negative voltage (ground) contacts 230, 232, respectively. The connection of the monolithic IC 224 to the receiving loop 16 may preferably be achieved through DC blocking capacitors 234 and 236 configured as "hanging"

components to the IC 224. Additionally, a contact 238 is provided for coupling to an external speaker or other audio signal output device. For applications where a suitably compact receiving loop or coil 16 is employed, the monolithic IC 224 and receiving loop 16 may be mounted together on a circuit board 240 providing a very compact and easily manufactured implementation of the receiver portion 12.

The monolithic modulator and demodulator ICs, 210 and 224, respectively, will preferably have a minimum amount of external or "hanging" components. The magnetic elements 14, 16 and audio transducers such as microphones, earspeakers, and loudspeakers must be hanging components. Other such hanging components may include large value DC blocking capacitors, and external resistors and capacitors for setting parametric levels.

Figure 21:
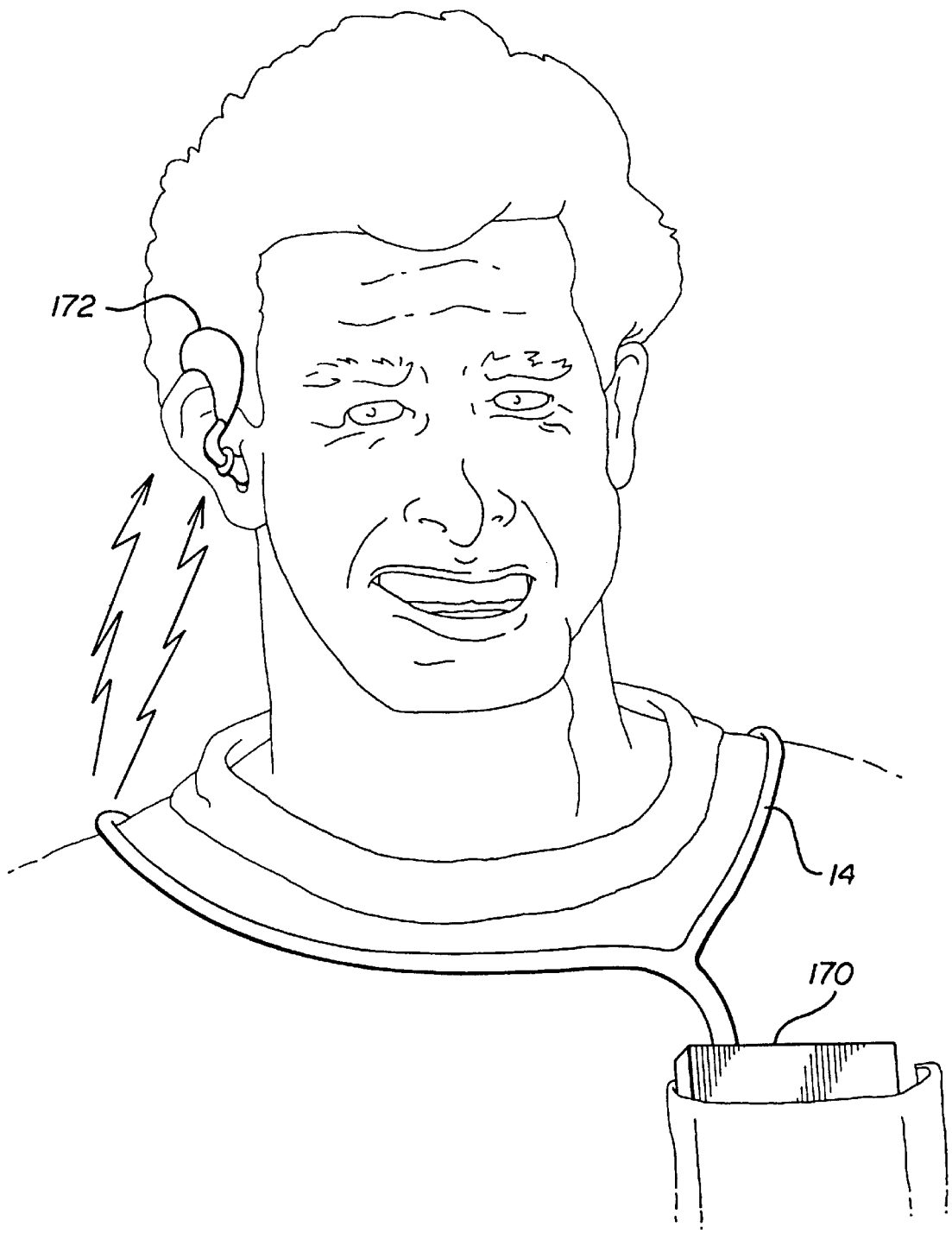
FIG. 21 is a drawing illustrating an implementation of the present invention employing a neck worn transmission loop and a head worn receiver.
Figure 22:
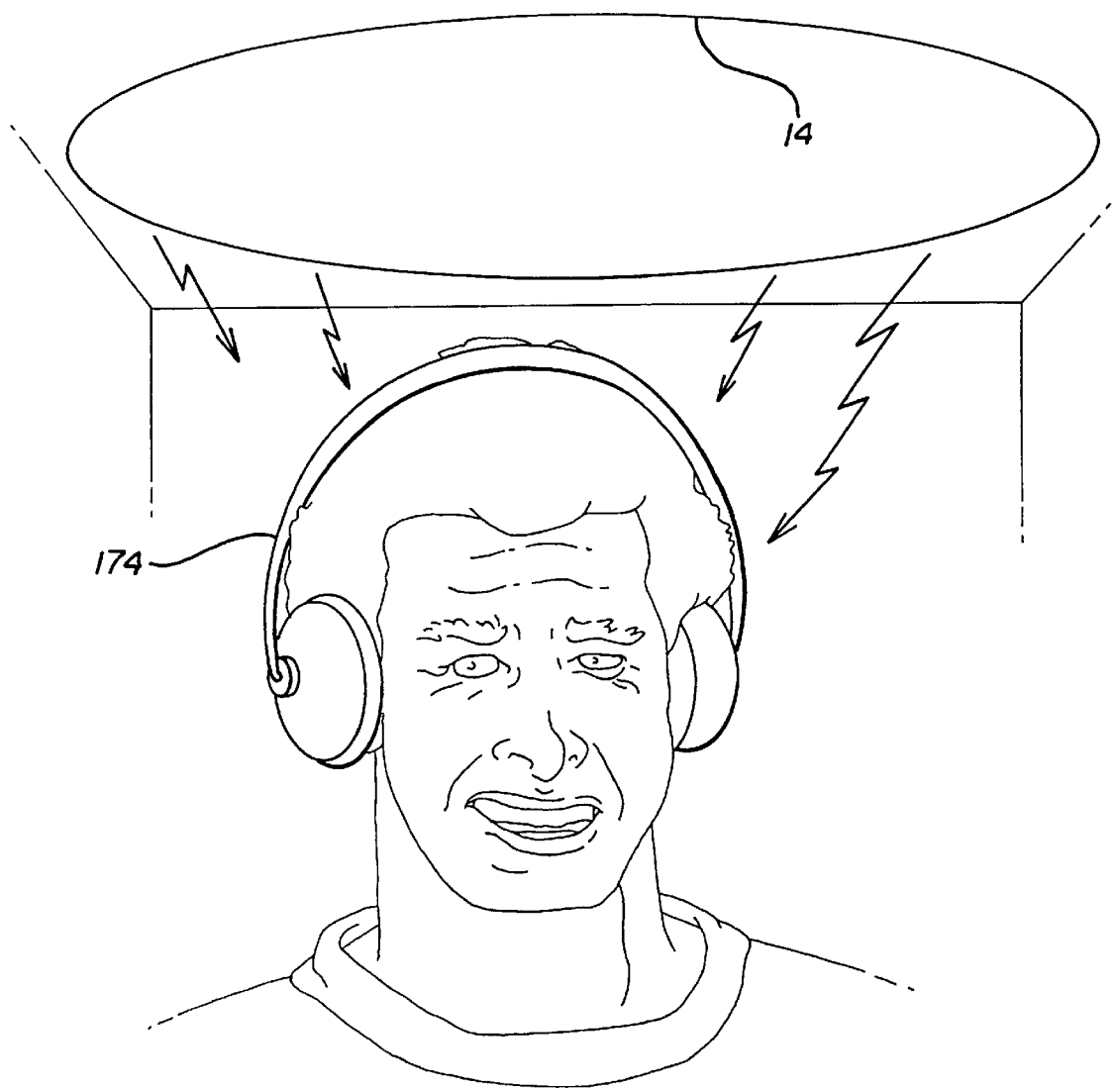
FIG. 22 is a drawing of an alternate implementation of the present invention employing a head worn receiving unit and a transmission loop integrated into a large area such as the ceiling or walls of a room.

Referring to FIGS. 21 and 22, two illustrative implementations of the short range magnetically coupled wireless transmission system of the present invention are shown.

More specifically, in FIG. 21 the system of the present invention is illustrated in an implementation employing a neck worn transmission magnetic element 14, in the form of a simple loop, which receives the TVM transmission pulses from a pocket or belt worn transmitter unit 170. The compact transmitter unit 170 includes the transmission portion 10 of the wireless short range communication system illustrated in FIG. 1, including a portable battery power supply and a receiver/transducer adapted for the specific application. For example, in the case of a hearing assist application, the transmitter unit 170 may include an RF receiver for receiving audio signals from an instructor held microphone broadcast through a conventional RF transmission system. Alternatively, the transmitter unit 170 may include a transducer, such as a conventional microphone, for picking up external sounds and amplifying them for transmission via the neck loop.

The receiver portion 12 of the communication system in turn is configured in a compact receiver unit 172. As illustrated in FIG. 21, the receiver unit 172 may be configured as a behind the ear (BTE) hearing aid or it may equally be configured as an in the ear (ITE) hearing aid or as a headset adapted to be worn by the user. Due to the aforementioned low power and good noise resolution capabilities of the present invention, the receiver unit 172 is readily adapted to a small battery power supply while at the same time providing good audio quality for the user.

Referring to FIG. 22, an alternate embodiment is illustrated where the transmission magnetic element 14 is configured in an area, such as a portion of an enclosure such as a room or auditorium, where one or several users wearing receiving units may pick up the transmitted audio frequency signal. As illustrated, the transmission magnetic element 14 may be a large diameter loop encircling the area, such as a room or portion thereof, such that a good magnetic coupling between the transmission magnetic element and the receiving magnetic element is provided. As further illustrated the receiving unit may take the form of a headset 174. Alternatively, the receiving unit may be one of the ITE or BTE types of hearing aids described previously in relation to FIG. 21. The transmission magnetic element 14 may also be configured in an electronic enclosure or in a portion of the floor, walls or even in a table or like item of furniture configured in the room, with the specific configuration of the magnetic element being adapted for the specific application. For example, in the case of a system desired for broadcast to multiple users around a conference room table, the transmission magnetic element 14 could be a loop configured under or within the table surface resulting in good magnetic coupling between the transmission magnetic element and a plurality of receiving units.

While a magnetic element 14 is illustrated in FIG. 22 as a single loop, it will be appreciated that multiple loops may be employed. Also, a magnetic element with a more complicated geometry may be employed. For example, a single magnetic element configured in a "figure 8" type geometry may provide added directionality to the magnetic element coupling field. Alternatively, an array of independently driven magnetic elements may be provided for ensuring good coupling to all portions of a large enclosed area, such as an auditorium.

It will therefore be appreciated that a wide range of transmission magnetic element geometries and dimensions may be employed ranging from a fraction of an inch to 100 or more meters in diameter.

In view of the foregoing, it will be appreciated that the short range wireless communication system of the present invention provides significant advantages over presently available alternative approaches. In particular, relative to a base band inductively coupled system, the time variant modulated pulse transmission system of the present invention eliminates the strong dependence of the received signal on orientation or distance of the receiving magnetic element from the transmitting loop. Also, the signal to noise ratio is substantially unaffected by the distance and orientation between the two loops. In contrast, in a base band system, for example in the case of a head worn system, merely turning the user's head could cause a significant shift in noise level and audio signal volume. Increasing the distance between the receiver and transmitter also reduces the audio signal volume.

Figure 23:
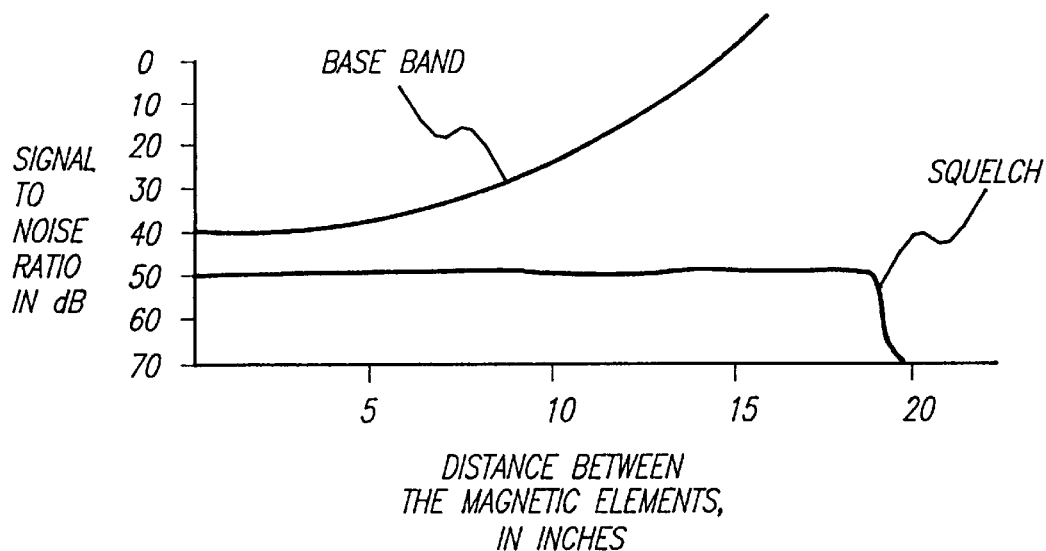
FIG. 23 is a graph of signal to noise ratio versus distance for both a base band inductively coupled transmission system and for the system of the present invention.

This advantage of the communication system of the present invention over a base band system is illustrated in FIG. 23 which shows the effects of distance on the signal to noise ratio for a TVM transmission system in accordance with the present invention and for a typical base band system. It will be appreciated from FIG. 23 that the system of the present invention maintains a relatively constant signal to noise ratio over distance. A base band system in contrast has a signal to noise ratio which deteriorates immediately over distance.

As mentioned previously, a number of common electrical devices generate interference in the area of 3 mG. In order to have a usable signal to noise ratio, a base band system must operate above the electrical noise field, in this case above 3 mG, since operating below 3 mG would cause an increase in noise. It is possible, with TVM, to take advantage of signal levels at or below the 3 mG electrical interference level by building a more sensitive TVM receiver.

This may be further appreciated by a specific quantitative comparison of signal to noise ratios (S/N) at different distances as set out in Tables 3 and 4. The measurements were done with a loop current of 4.6 mA at 10 volts. The modulating technique used was symmetry modulation. The geometry is the same as illustrated in FIG. 3. In Table 4 a quantitative comparison of bandwidth is also provided.

TABLE 3

| Y = | Base Band No Filter S/N (dB) | Base Band Filter S/N (dB) | T.V.M. S/N (dB) |
|---|---|---|---|
| 3 | 49 | 34 | 58 |
| 6 | 39 | 21 | 58 |
| 9 | 32 | 17 | 55 |

TABLE 3-continued

| Y = | Base Band No Filter S/N (dB) | Base Band Filter S/N (dB) | T.V.M. S/N (dB) |
|---|---|---|---|
| 12 | 25 | 10 | 45 |
| 15 | 21 | 6 | 34 |
| 18 | 18 | 4 | 32 |

TABLE 4

| | Y = | 3" | 7" | 10" | 20" | 10 feet |
|---|---|---|---|---|---|---|
| Base Band | Low | 150 Hz | 300 Hz | 300 Hz | 300 Hz | 450 Hz |
| | High | 6 kHz | 5 kHz | 5 kHz | 5 kHz | 3.5 kHz |
| | S/N (dB) | 45 | 40 | 40 | 40 | 40 |
| TVM | Low | DC | DC | DC | DC | DC |
| | High | 8 kHz | 8 kHz | 8 kHz | 8 kHz | 8 kHz |
| | S/N (dB) | 56 | 56 | 58 | 48 | 48 |

Figure 24A:
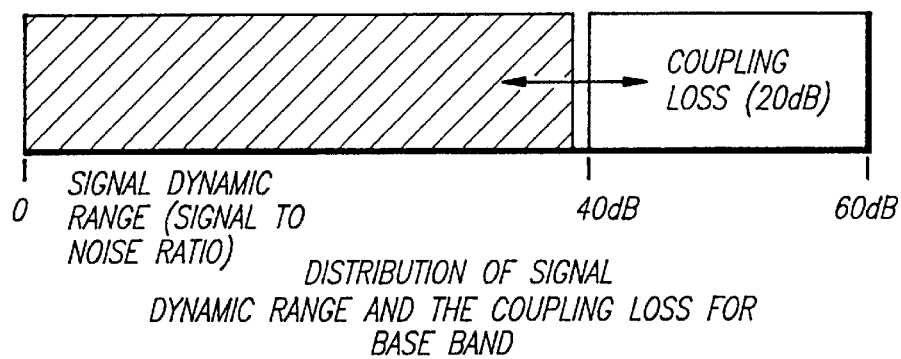
FIGS. 24A and 24B are drawings illustrating signal dynamic range and coupling loss for base band inductive coupling and the system of the present invention, respectively.
Figure 24B:
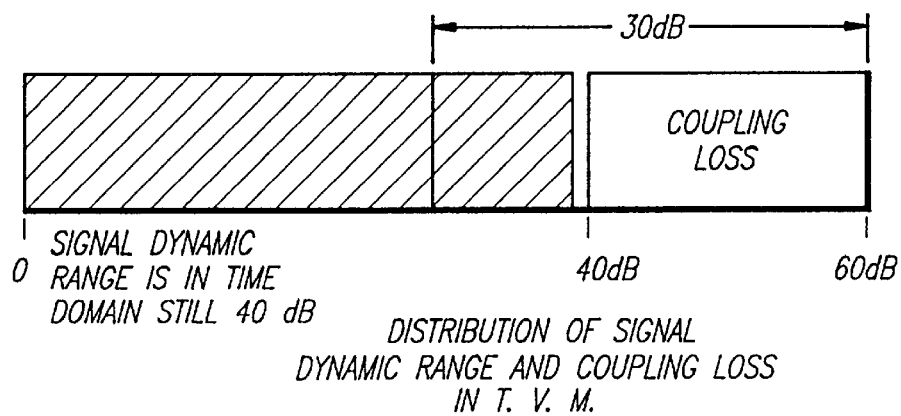

Further, in the system of the present invention, a wide dynamic range signal may be transmitted with low power and good noise immunity. For example, in contrast to that shown in FIG. 24A, in FIG. 24B, a fixed 20 dB pulse train signal is sufficient to allow a 60 dB or greater dynamic range audio signal to be transmitted. In this case, a transmission loss varying from 0 dB to 60 dB neither affects the output level nor the signal to noise ratio.

Figure 25:
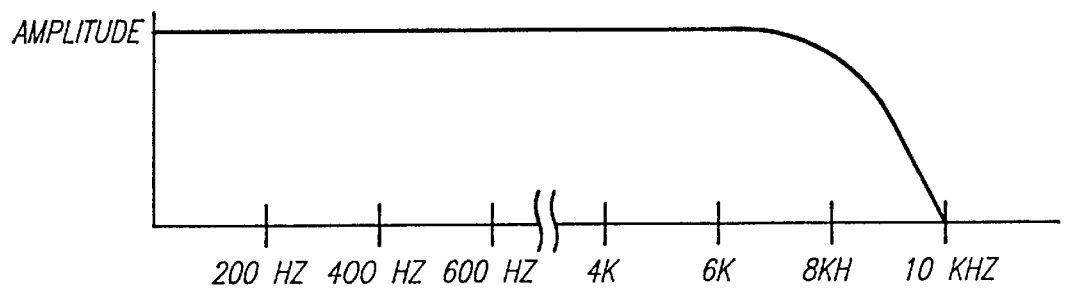
FIG. 25 is a graph illustrating amplitude versus frequency for transmission with the system of the present invention.
Figure 26:
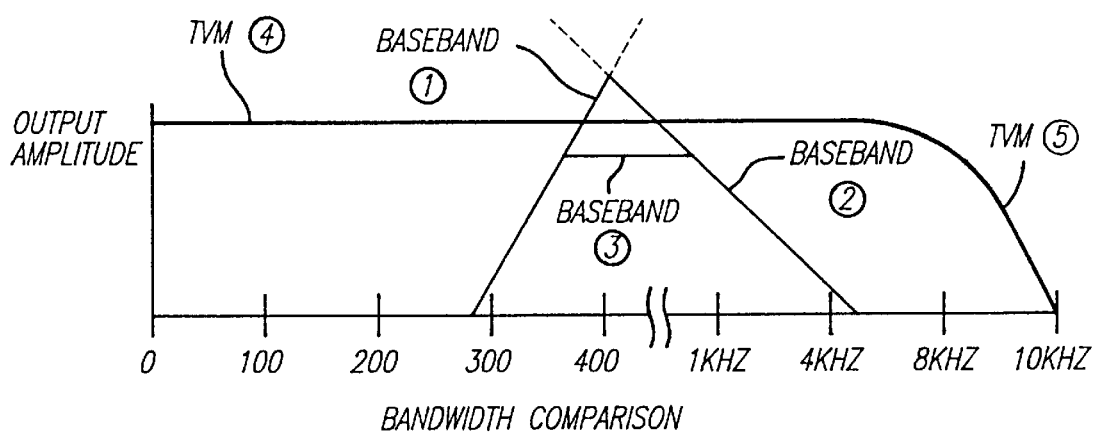
FIG. 26 is a graph of amplitude versus frequency comparatively illustrating the bandwidth characteristics of base band inductive coupling and the transmission system of the present invention.

In addition, the communication system of the present invention enjoys significant frequency response advantages over base band, as shown in FIGS. 25–27.

More specifically, as shown in FIG. 25, the system of the present invention delivers wide bandwidth. This wide bandwidth provides much more intelligibility—a factor much needed for hearing assistive applications.

As shown in FIG. 26, base band has a relatively narrow bandwidth. More specifically base band systems have a low frequency limitation (1) due to $d\phi/dt$ decreasing with decreasing frequency. A second limitation (2) is high frequency roll-off due to inductance in the magnetic coupling elements. A further limitation (3) is present since equalization is needed to flatten the response for acceptable operation.

As shown in FIG. 26, on the other hand, the TVM system of the present invention does not have a low frequency limitation and (4) has a frequency response down to DC. A high frequency roll-off (5) is present due to the filtering response of the integrator circuit (in a symmetry modulation embodiment) but does not substantially impact performance.

Also, relative to RF systems, the magnetic coupled system of the present invention provides both lower power and less cost in addition to avoiding the requirements for FCC certification in practical applications.

Accordingly, it will be appreciated that the system of the present invention provides a highly effective short range wireless communication system readily adapted to a variety of applications including both applications presently employing wireless communication techniques as well as applications where cord coupling of the transmitter and receiver have typically been employed.

We claim:

1. A hearing assist system for receiving an audio frequency input signal and retransmitting it to a hearing aid, comprising:
   a first receiver for receiving a wirelessly transmitted signal and providing an analog audio frequency signal corresponding to the received signal;
   transmission means, coupled to the receiver, for receiving said analog audio frequency signal as an input and for providing a pulse sequence time variant modulated by said analog audio frequency input signal, said transmission means including a transmission magnetic element for transmitting said pulse sequence;
   a hearing aid; and
   a second receiver, physically connected to said hearing aid, including a receiving magnetic element magnetically coupled to said transmission magnetic element, for receiving said pulse sequence and for demodulating said pulse sequence to reproduce said analog audio frequency input signal and for providing said analog audio frequency input signal to said hearing aid, said second receiver including means for removing any amplitude varying component from said pulse sequence before reproducing said analog audio frequency input signal.

2. A hearing assist system as set out in claim 1, wherein the hearing aid is adapted to be worn in the ear of the user.

3. A hearing assist system as set out in claim 1, wherein the hearing aid is adapted to be worn behind the ear of the user.

4. A hearing assist system as set out in claim 1, wherein the transmission magnetic element is a neck loop adapted to be worn about the neck of the user.

5. A hearing assist system as set out in claim 4, wherein the first receiver is coupled to the neck loop so as to hang from the neck loop.

6. A hearing assist system as set out in claim 4, wherein the first receiver is coupled to the neck loop and is adapted to be worn by the user on a belt.

7. A hearing assist system as set out in claim 1, wherein the transmission magnetic element is configured in a large enclosure to be occupied by the user wearing the hearing aid.

8. A hearing assist system as set out in claim 7, wherein the enclosure is an auditorium.

9. A hearing assist system as set out in claim 7, wherein a plurality of transmission magnetic elements are provided in the enclosure.

10. A hearing assist system as set out in claim 7, wherein the enclosure is a room.

11. A hearing assist system as set out in claim 1, wherein the first receiver is an RF receiver.

12. A hearing assist system as set out in claim 1, wherein said means for removing comprises a threshold detector.

13. A method for receiving and retransmitting an audio frequency input signal to a hearing aid, comprising the steps of:
   receiving a wirelessly transmitted signal and providing an analog audio frequency signal corresponding to the received signal;
   providing a pulse sequence;
   time variant modulating said pulse sequence with said analog audio frequency signal to provide a time variant modulated pulse sequence;
   transmitting said time variant modulated pulse sequence employing a magnetic transmission element;
   receiving said time variant modulated pulse sequence at the hearing aid by employing magnetic coupling of a magnetic receiving element to said magnetic transmission element;
   removing any amplitude varying component from said received pulse sequence;
   demodulating said time variant modulated pulse sequence to reproduce said analog audio frequency signal; and
   providing said analog audio frequency signal to said hearing aid.

14. A method as set out in claim 13, wherein said step of receiving a wirelessly transmitted signal comprises receiving an RF signal.

15. A method as set out in claim 13, wherein said step of transmitting the time variant modulated pulse sequence comprises providing the pulse sequence to a transmission loop configured in an enclosure to be occupied by the hearing aid user.

16. A method as set out in claim 13, wherein said step of transmitting the pulse sequence comprises providing the pulse sequence to a transmission loop configured in an enclosure to be occupied by the hearing aid user.

17. A method as set out in claim 16, wherein said step of transmitting the pulse sequence comprises providing the pulse sequence to a transmission loop configured in the ceiling of a room.

18. A method as set out in claim 13, wherein said step of receiving a wirelessly transmitted signal comprises receiving the signal at a receiver adapted to be worn by the user of the hearing aid.

19. A method as set out in claim 12, wherein said step of removing comprises detecting when the pulses in the pulse sequence exceed a threshold value.

* * * * *